(12) United States Patent
Lichtenwalner et al.

(10) Patent No.: US 12,094,876 B2
(45) Date of Patent: Sep. 17, 2024

(54) CONDUCTION ENHANCEMENT LAYERS FOR ELECTRICAL CONTACT REGIONS IN POWER DEVICES

(71) Applicant: Wolfspeed, Inc., Durham, NC (US)

(72) Inventors: Daniel Jenner Lichtenwalner, Raleigh, NC (US); Woongsun Kim, Cary, NC (US)

(73) Assignee: Wolfspeed, Inc., Durham, NC (US)

( * ) Notice: Subject to any disclaimer, the term of this patent is extended or adjusted under 35 U.S.C. 154(b) by 0 days.

(21) Appl. No.: 16/863,797

(22) Filed: Apr. 30, 2020

(65) Prior Publication Data

US 2021/0343708 A1 Nov. 4, 2021

(51) Int. Cl.
| | | |
|---|---|---|
| *H01L 27/088* | (2006.01) | |
| *H01L 23/528* | (2006.01) | |
| *H01L 23/532* | (2006.01) | |
| *H01L 29/10* | (2006.01) | |
| *H01L 29/16* | (2006.01) | |

(Continued)

(52) U.S. Cl.
CPC ......... *H01L 27/088* (2013.01); *H01L 23/528* (2013.01); *H01L 23/53257* (2013.01); *H01L 29/1095* (2013.01); *H01L 29/1608* (2013.01); *H01L 29/36* (2013.01); *H01L 29/7813* (2013.01)

(58) Field of Classification Search
CPC ... H01L 27/088; H01L 29/1095; H01L 29/36; H01L 23/53257; H01L 23/528; H01L 29/7813; H01L 29/1608; H01L 29/4236; H01L 29/42352; H01L 29/66613–66628; H01L 29/42356; H01L 29/0696; H01L 29/4925; H01L 29/4238; H01L 29/7811; H01L 29/7802
See application file for complete search history.

(56) References Cited

U.S. PATENT DOCUMENTS

| | | | |
|---|---|---|---|
| 2002/0190313 A1* | 12/2002 | Takaishi | H01L 29/7813 257/E27.06 |
| 2010/0258863 A1* | 10/2010 | Kaneko | H01L 29/42376 257/330 |
| 2011/0284874 A1 | 11/2011 | Miura et al. | |

(Continued)

FOREIGN PATENT DOCUMENTS

| | | |
|---|---|---|
| EP | 0782201 A1 | 7/1997 |
| JP | 2014038963 A | 2/2014 |

OTHER PUBLICATIONS

PCT Notification of Transmittal of the International Search Report and the Written Opinion of the International Searching Authority, or the Declaration, mailed Jul. 9, 2021, for corresponding PCT International Application No. PCT/US2021/029115.

*Primary Examiner* — Cuong B Nguyen

(74) *Attorney, Agent, or Firm* — Myers Bigel, P.A.

(57) ABSTRACT

Power switching devices include a semiconductor layer structure, a plurality of unit cell transistors that are electrically connected in parallel, each unit cell transistor including a gate finger that has a longitudinal axis that extends in a first direction on the semiconductor layer structure, the gate fingers spaced apart from each other along a second direction, and a gate connector having a longitudinal axis that extends in the second direction, the gate connector connected to the gate fingers of the plurality of unit cell transistors.

29 Claims, 27 Drawing Sheets

(51) Int. Cl.
*H01L 29/36* (2006.01)
*H01L 29/78* (2006.01)

(56) References Cited

U.S. PATENT DOCUMENTS

| | | | |
|---|---|---|---|
| 2012/0032261 A1* | 2/2012 | Hsieh | H01L 29/0696 |
| | | | 257/334 |
| 2013/0069143 A1 | 3/2013 | Yeh et al. | |
| 2017/0301788 A1* | 10/2017 | Fukui | H01L 29/0661 |
| 2019/0013313 A1* | 1/2019 | Naito | H01L 29/8613 |
| 2019/0088776 A1 | 3/2019 | Shimomura et al. | |
| 2019/0378922 A1* | 12/2019 | Nakano | H01L 29/4925 |

* cited by examiner

CONDUCTION ENHANCEMENT LAYERS FOR ELECTRICAL CONTACT REGIONS IN POWER DEVICES

FIELD

The present invention relates to semiconductor devices and, more particularly, to power semiconductor switching devices.

BACKGROUND

The Metal Insulating Semiconductor Field Effect Transistor ("MISFET") is a well-known type of semiconductor transistor that may be used as a switching device. A MISFET is a three terminal device that has gate, drain and source terminals and a semiconductor body. A source region and a drain region are formed in the semiconductor body that are separated by a channel region, and a gate electrode (which may act as the gate terminal or be electrically connected to the gate terminal) is disposed adjacent the channel region. A MISFET may be turned on or off by applying a bias voltage to the gate electrode. When a MISFET is turned on (i.e., it is in its "on-state"), current is conducted through the channel region of the MISFET between the source region and drain regions. When the bias voltage is removed from the gate electrode (or reduced below a threshold level), the current ceases to conduct through the channel region. By way of example, an n-type MISFET has n-type source and drain regions and a p-type channel. An n-type MISFET thus has an "n-p-n" design. An n-type MISFET turns on when a gate bias voltage is applied to the gate electrode that is sufficient to create a conductive n-type inversion layer in the p-type channel region that electrically connects the n-type source and drain regions, thereby allowing for majority carrier conduction therebetween.

The gate electrode of a power MISFET is typically separated from the channel region by a thin gate insulator. In most cases, the gate insulator is an oxide (e.g., a silicon oxide). A MISFET that has an oxide gate insulator is referred to as a Metal Oxide Semiconductor Field Effect Transistor ("MOSFET"). As oxide gate insulators are almost always used due to their superior properties, the discussion herein will focus on MOSFETs as opposed to MISFETs, but it will be appreciated that the techniques according to embodiments of the present invention that are described herein are equally applicable to devices having gate insulators formed with materials other than oxides.

Because the gate electrode of the MOSFET is insulated from the channel region by the gate insulator, minimal gate current is required to maintain the MOSFET in its on-state or to switch a MOSFET between its on-state and its off-state. The gate current is kept small during switching because the gate forms a capacitor with the channel region. Thus, only minimal charging and discharging current is required during switching, allowing for less complex gate drive circuitry and faster switching speeds. MOSFETs may be stand-alone devices or may be combined with other circuit devices. For example, an Insulated Gate Bipolar Transistor ("IGBT") is a semiconductor device that includes both a MOSFET and a Bipolar Junction Transistor ("BJT") that combines the high impedance gate electrode of the MOSFET with small on-state conduction losses that may be provided by a BJT. An IGBT may be implemented, for example, as a Darlington pair that includes a high voltage n-channel MOSFET at the input and a BJT at the output. The base current of the BJT is supplied through the channel of the MOSFET, thereby allowing a simplified external drive circuit (since the drive circuit only charges and discharges the gate electrode of the MOSFET).

There is an increasing demand for high power semiconductor switching devices that can pass large currents in their "on" state and block large voltages (e.g., thousands of volts) in their reverse blocking state. In order to support high current densities and block such high voltages, power MOSFETs and IGBTs typically have a vertical structure with the source and drain on opposite sides of a thick semiconductor layer structure in order to block higher voltage levels. In very high power applications, the semiconductor switching devices are typically formed in wide band-gap semiconductor material systems (herein, the term "wide band-gap semiconductor" encompasses any semiconductor having a band-gap of at least 1.4 eV) such as, for example, silicon carbide ("SiC"), which has a number of advantageous characteristics including, for example, a high electric field breakdown strength, high thermal conductivity, high electron mobility, high melting point and high-saturated electron drift velocity. Relative to devices formed using other semiconductor materials such as, for example, silicon, electronic devices formed using silicon carbide may have the capability of operating at higher temperatures, at high power densities, at higher speeds, at higher power levels and/or under high radiation densities.

SUMMARY

Pursuant to some embodiments of the present invention, a semiconductor device includes a semiconductor layer structure, a plurality of unit cell transistors that are electrically connected in parallel, each unit cell transistor including a gate finger that has a longitudinal axis that extends in a first direction on the semiconductor layer structure, the gate fingers spaced apart from each other along a second direction, and a gate connector having a longitudinal axis that extends in the second direction, the gate connector connected to the gate fingers of the plurality of unit cell transistors.

In some embodiments, the gate connector comprises titanium (Ti), titanium nitride (TiN), tantalum (Ta), tantalum nitride (TaN), and/or tungsten (W).

In some embodiments, a thickness of the gate connector is between 10 nm to 500 nm.

In some embodiments, the gate connector is a first portion of the gate connector, and the gate connector further comprises a second portion that extends in the first direction to contact an upper surface of a gate finger of one of the plurality of unit cell transistors.

In some embodiments, the gate connector further comprises a third portion that extends in the first direction below an upper surface of the semiconductor layer structure.

In some embodiments, a lower surface of the gate connector contacts surfaces of the gate fingers.

In some embodiments, a gate electrode of one of the gate fingers extends below an upper surface of the semiconductor layer structure.

In some embodiments, the gate electrode contacts a portion of the gate connector.

In some embodiments, the semiconductor device further includes a connector insulating layer between the gate connector and the semiconductor layer structure.

In some embodiments, the connector insulating layer extends in the second direction on an upper surface of the semiconductor layer structure between adjacent ones of the gate fingers.

In some embodiments, the gate connector is physically connected to respective ones of the gate fingers.

Pursuant to some embodiments of the present invention, a semiconductor device includes a semiconductor layer structure, a gate pad on the semiconductor layer structure and a gate electrode structure on the semiconductor layer structure and electrically coupled to the gate pad. The gate electrode structure includes a plurality of gate fingers each comprising a first material that extends in a first direction on the semiconductor layer structure and a gate connector comprising a second material that extends on and is connected to a gate finger of the plurality of gate fingers.

In some embodiments, a first conductivity of the first material of the gate fingers is lower than a second conductivity of the second material of the gate connector.

In some embodiments, the first material comprises polysilicon or silicide.

In some embodiments, the second material comprises titanium (Ti), titanium nitride (TiN), tantalum (Ta), tantalum nitride (TaN), and/or tungsten (W).

In some embodiments, the gate connector extends in a second direction that crosses the first direction, and the gate connector extends on the plurality of gate fingers.

In some embodiments, the gate connector comprises a first portion and a second portion, the first portion of the gate connector extends in the first direction on the plurality of gate fingers, and the second portion of the gate connector extends in the second direction on the plurality of gate fingers.

In some embodiments, the gate connector further comprises a third portion that extends in the first direction below an upper surface of the semiconductor layer structure.

In some embodiments, the gate connector extends in the first direction, and the gate connector extends on a gate finger of the plurality of gate fingers.

In some embodiments, a respective gate electrode of the plurality of gate fingers extends below an upper surface of the semiconductor layer structure.

In some embodiments, the semiconductor device further includes a connector insulating layer extending between adjacent ones of the plurality of gate fingers, and the connector insulating layer is between the gate connector and the semiconductor layer structure.

In some embodiments, the semiconductor device further includes a connector electrode layer between the connector insulating layer and the gate connector.

Pursuant to some embodiments of the present invention, a semiconductor device includes a semiconductor layer structure, a first gate electrode and a second gate electrode on the semiconductor layer structure, and a gate connector extending on and connected to the first gate electrode, extending on and connected to the second gate electrode, and extending on a portion of the semiconductor layer structure between the first gate electrode and the second gate electrode.

In some embodiments, the semiconductor device further includes a connector insulating layer between the gate connector and the semiconductor layer structure.

In some embodiments, the connector insulating layer extends between the first gate electrode and the second gate electrode.

In some embodiments, the gate connector comprises a first material and the first gate electrode and the second gate electrode comprise a second material, different from the first material.

In some embodiments, a first conductivity of the first material of the first gate electrode and the second gate electrode is lower than a second conductivity of the second material of the gate connector.

In some embodiments, the first material comprises polysilicon or silicide.

In some embodiments, the second material comprises titanium (Ti), titanium nitride (TiN), tantalum (Ta), tantalum nitride (TaN), and/or tungsten (W).

In some embodiments, the gate connector comprises a plurality of layers.

In some embodiments, the gate connector is a first portion of the gate connector, and the gate connector further comprises a second portion that crosses the first portion to contact an upper surface of the first gate electrode.

In some embodiments, the gate connector further comprises a third portion that contacts the first gate electrode below an upper surface of the semiconductor layer structure.

In some embodiments, the gate connector is physically connected to the first gate electrode and the second gate electrode.

DETAILED DESCRIPTION

Figure 1A:
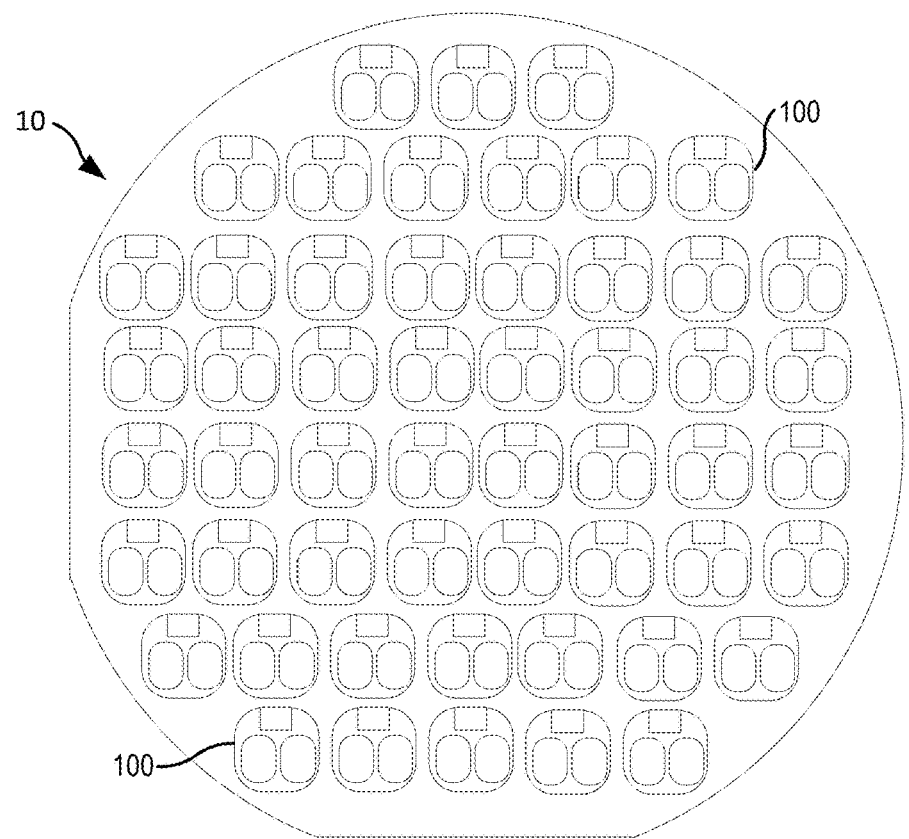
FIG. 1A is a schematic plan view of a semiconductor wafer that includes a plurality of power switching devices according to embodiments of the present invention.

Power silicon carbide MOSFETs are in use today for applications requiring high voltage blocking such as voltage blocking of 5,000 volts or more. By way of example, silicon carbide MOSFETs are commercially available that are rated for current densities of 10 A/cm$^2$ or more that will block voltages of at least 10 kV. To form such devices, a plurality of "unit cells" structures are typically formed, where each unit cell structure includes a MOSFET transistor. In high power applications, a large number of these unit cells (e.g., hundreds or thousands) are typically provided on a single semiconductor substrate, and a gate electrode is formed on a top side of the semiconductor substrate that acts as the gate electrode for all of the unit cells. The opposite (bottom) side of the semiconductor substrate acts as a common drain for all of the units cells of the device. A plurality of source contacts are formed on source regions in the semiconductor layer structure that are exposed within openings in the gate electrode. These source contacts are also electrically connected to each other to serve as a common source. The resulting device has three terminals, namely a common source terminal, a common drain terminal, and a common gate electrode that act as the terminals for the hundreds or thousands of individual unit cell transistors. It will be appreciated that the above description is of an n-type MOSFET; the locations of the drain and source would be reversed for a p-type MOSFET.

The gate electrode of a power MOSFET may be implemented by forming a patterned conductive layer that includes a plurality of elongated gate fingers that extend through an active region of the device. The patterned conductive layer may comprise a semiconductor layer such as, for example, a polysilicon layer and/or doped silicon (Si). The patterned conductive layer may also include a gate pad in an inactive region of the device, and each gate finger may connect to the gate pad, either directly or by one or more gate buses and/or conductive vias.

The present disclosure describes an approach to better control the gate resistance of a power MOSFET and/or IGBT (e.g., gate controlled devices). The embodiments described herein may be helpful for both planar and trenched gate devices. For example, some device structures provide only a small volume or region for the gate electrode, as in narrow filled trenches. Thus, an approach is needed to properly connect them so the gate signal can be uniformly and quickly (in time) applied to the entire device.

The approaches described herein may provide devices having a lower gate resistance associated with the gate electrode by using perpendicular interconnecting stripes coupled to a top surface of the gate electrode, and by using materials more conducting than the material used for the gate electrode. For example, a gate connector including a material that is more conductive than the material of the gate electrode may be used. Materials of the gate electrode may include, but are not limited to, polycrystalline silicon (Si) (also referred to herein as "polysilicon" or "poly"). Embodiments described herein may help to lower gate resistance in gate-controlled devices, including trench and/or planar devices, and improve the ability to switch efficiently at high frequency.

FIG. 1A is a schematic plan view of a wafer 10 that includes a plurality of power switching devices 100 according to embodiments of the present invention. Referring to FIG. 1A, the wafer 10 may be a thin planar structure that includes a semiconductor layer structure with other material layers such as insulating layers and/or metal layers formed thereon. The semiconductor layer structure may include a semiconductor substrate and/or a plurality of other semiconductor layers. A plurality of power switching devices 100 may be formed using the wafer 10. The switching devices 100 may be formed in rows and columns and may be spaced apart from each other so that the wafer 10 may later be singulated (e.g., diced) to separate the individual switching devices 100 for packaging and testing. The wafer 10 may comprise a silicon carbide substrate having one or more silicon carbide layers formed thereon (e.g., by epitaxial growth) in some embodiments. Other semiconductor layers (e.g., polysilicon layers), insulating layers, and/or metal layers may be formed on the silicon carbide semiconductor layer structure to form the power switching devices 100. The silicon carbide substrate and the silicon carbide layers formed thereon may be 4H silicon carbide in some embodiments, though the present disclosure is not limited thereto. The number and arrangement of power switching devices 100 illustrated in FIG. 1A are merely an example in which the sizes of the power switching devices 100 have been exaggerated for ease of description.

Figure 1B:
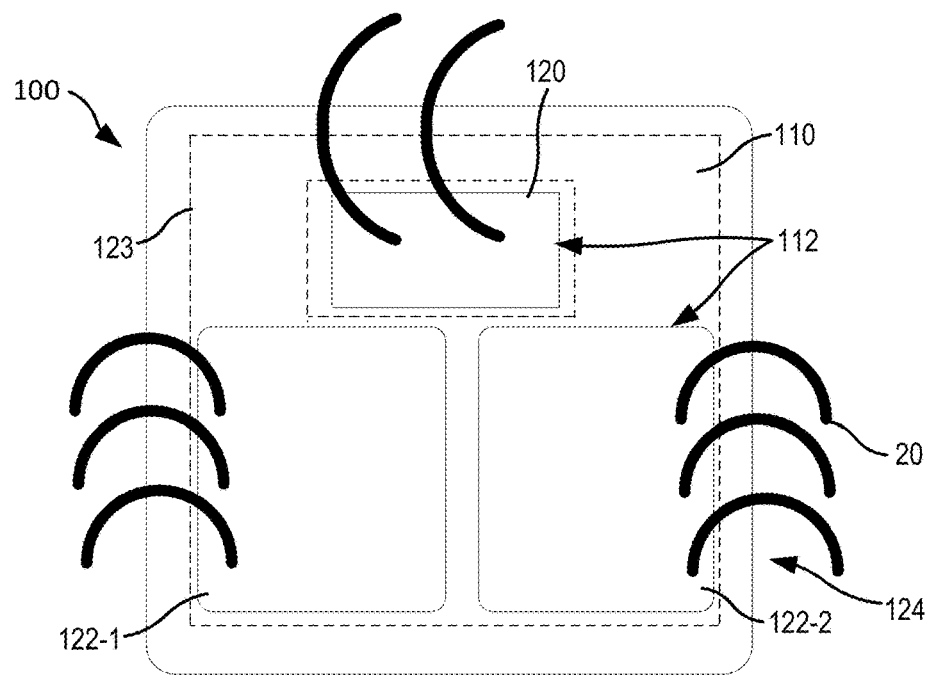
FIG. 1B is a schematic plan view of one of the power switching devices included on the semiconductor wafer of FIG. 1A.
Figure 1C:
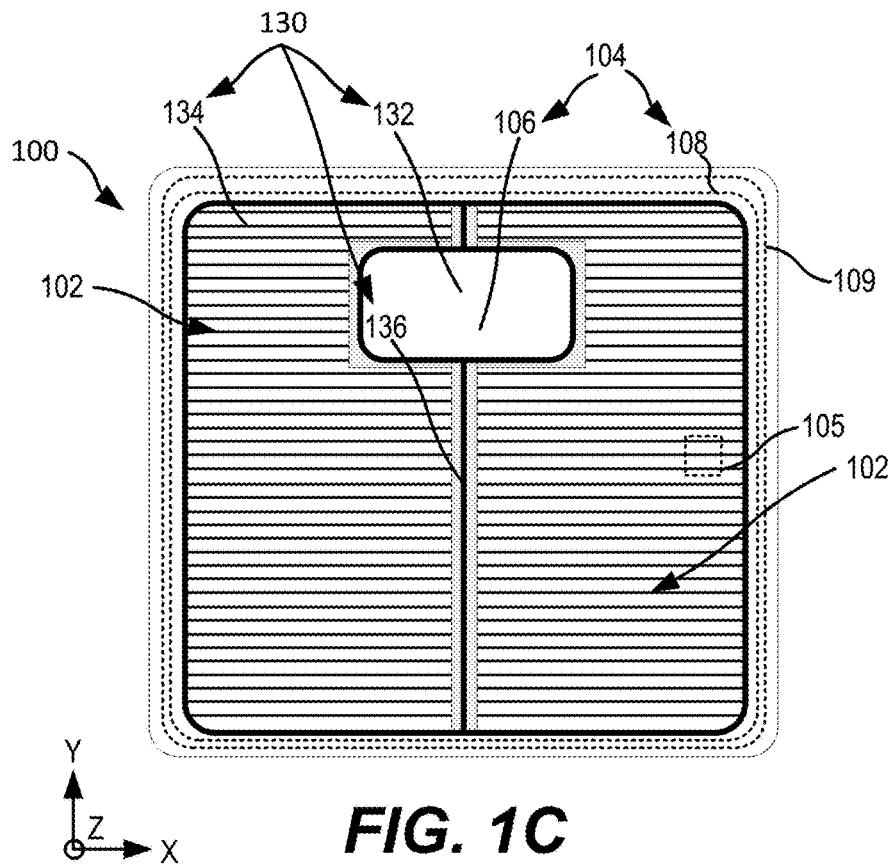
FIG. 1C is a schematic plan view of an example of the power switching device of FIG. 1B with the source and gate metallization removed.
Figure 1D:
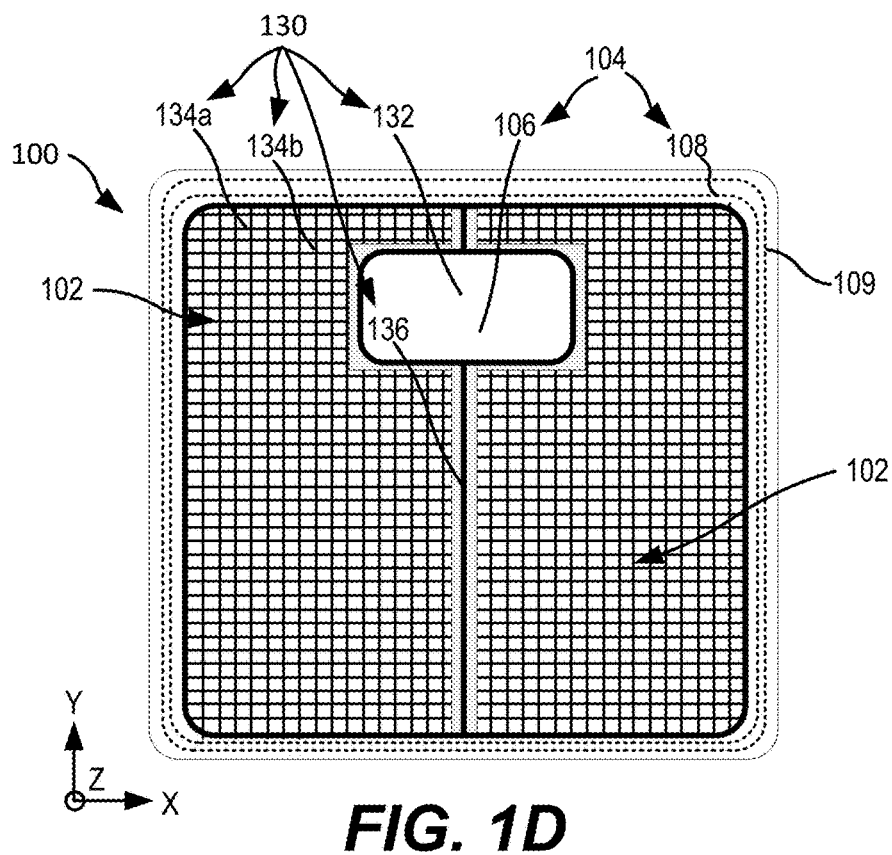
FIG. 1D is a schematic plan view of an additional example of the power switching device of FIG. 1B.

FIG. 1B is a schematic plan view of one of the power switching devices 100 included on the semiconductor wafer 10 of FIG. 1A. FIGS. 1C and 1D are schematic plan views of examples of the power switching device 100 of FIG. 1B with the source and gate metallization removed. In the description below it is assumed that the power switching device 100 is an n-type power MOSFET 100, but the present invention is not limited thereto. The embodiments described herein may be equally applied to p-type devices.

As shown in FIG. 1B, a protective layer 110 covers a substantial portion of the top surface of the power MOSFET 100. The protective layer 110 may be formed, for example, of polyamide. Various bond pads may be exposed through openings 112 in the protective layer 110. The bond pads may include a gate bond pad 120 and one or more source bond pads 122. The configuration, shape, and structure of the gate bond pad 120 and source bond pads 122 illustrated in FIG.

1B are merely examples, and the embodiments described herein are not limited thereto. Two source bond pads 122-1, 122-2 are illustrated in FIG. 1B. While not visible in FIG. 1B, a drain contact and/or bond pad 124 may be provided on the bottom side of the MOSFET 100. The bond pads 120, 122, 124 may be formed of a metal, such as aluminum, that bond wires can be readily attached to via conventional techniques such as thermo-compression or soldering. Source contacts may be provided that contact a semiconductor layer structure of the MOSFET 100. The source contacts may be lower portions of a source metal layer 123 that extends across much of the upper surface of the MOSFET 100 (e.g., all but the portion of the upper surface of the MOSFET 100 occupied by the gate bond pad 120). The source bond pads 122-1, 122-2 may comprise portions of the source metal layer 123 that are exposed by the openings 112 in the protective layer 110. Bond wires 20 are shown in FIG. 1B that may be used to connect the gate bond pad 120 and the source bond pads 122-1, 122-2 to external voltage sources (not shown) such as terminals of other circuit elements.

As is shown in FIG. 1C, the MOSFET 100 includes a semiconductor layer structure that includes an active region 102 and an inactive region 104. The active region 102 is an area of the device that includes operable transistors (e.g., the unit cell transistors discussed herein), while the inactive region 104 is an area that does not include such operable transistors. The unit cell transistors of the MOSFET 100 are formed in the active region 102. The location of a plurality of unit cells are shown by a box 105 in FIG. 1C to provide context.

The active region 102 may generally correspond to the area under the source metal layer 123 in some embodiments. The inactive region 104 includes a gate pad portion 106 and a termination portion 108. The gate pad portion 106 of the inactive region 104 may approximately correspond to the portion of the semiconductor layer structure that is underneath the gate bond pad 120. The termination portion 108 of the inactive region 104 may extend around a periphery of the MOSFET 100 and may include one or more termination structures such as guard rings and/or a junction termination extension that can reduce electric field crowding that may occur around the edge of the device. The termination structures (shown as guard rings 109) may spread out the electric fields along the periphery of the MOSFET 100, reducing electric field crowding. The edge termination structures may serve to increase the reverse blocking voltage at which a phenomenon known as "avalanche breakdown" occurs where an increasing electric field result in runaway generation of charge carriers within the semiconductor device, resulting in a sharp increase in current that may damage or even destroy the device.

As is further shown in FIG. 1C, a gate electrode structure 130 may be provided that includes a gate pad 132, a plurality of gate fingers 134, and one or more gate buses 136 that electrically connect the gate fingers 134 to the gate pad 132. The gate pad 132 of the gate electrode structure 130 may be underneath the gate bond pad 120 in the gate pad portion 106 of the inactive region 104, and the gate fingers 134 may extend (e.g., horizontally) across the active region 102. An insulating layer (not shown) may cover the gate fingers 134 and gate bus(es) 136. The source metal layer 123 may be provided over the gate fingers 134 and insulating layer, with the source contacts of the source metal layer contacting corresponding source regions in the semiconductor layer structure in openings between the gate fingers 134.

Referring to FIG. 1C, the gate fingers 134 may distribute a gate signal of the power switching device 100 throughout the active area 102. In some embodiments, gate fingers and/or stripes 134 of a gate electrode may extend in a common direction (e.g., the X direction in FIG. 1C). In some embodiments, the gate fingers 134 may include a conductive material (e.g., poly Si or a silicide). In some embodiments, the gate fingers 134 may be connected to a gate bus 136. Thus, a gate signal applied to the power switching device 100 may be communicated from the gate bond pad 120 to the gate pad 132, to the gate bus 136, and then to the gate finger 134. In some embodiments, the connection between the gate finger 134 and the gate bus 136 may occur only at the opposite ends of the gate finger 134.

The gate fingers 134 may be implanted as a trench configuration, in which a portion of the gate finger 134 extends below an upper surface of the semiconductor layer structure, and/or as a planar configuration, in which the gate finger 134 extends on an upper surface of the semiconductor layer structure.

In general, the material utilized in the gate bus 136 (which may be or contain, e.g., metal) may have a lower resistivity than that used in the gate fingers 134 (which may be or contain, e.g., polysilicon or silicide) The transition from the lower resistivity of the material of the gate bus 136 to the higher resistivity of the gate finger 134 tends to raise the gate resistance of the device. Moreover, the gate resistance of the device is also increased based on the length of the transmission distance of the gate signal along the length of the gate finger 134. In some embodiments, top metals (e.g., gate runners) may be used to transmit the gate signal to gate fingers across the device 100, but this takes up device active area.

One method that may be used to reduce the gate resistance of the device is to increase the number of gate fingers using a mesh layout. FIG. 1D illustrates an alternative example of the power switching device 100 of FIG. 1B that incorporates such a mesh layout. As illustrated in FIG. 1D, the gate electrode structure 130 may include first gate fingers 134a extending in a first direction (e.g., the X direction of FIG. 1D) and second gate fingers 134b extending in a second direction (e.g., the Y direction of FIG. 1D). The first and second gate fingers 134a, 134b may interconnect in a mesh layout. By using a mesh layout, an overall resistance of the gate region may be lowered, but a low resistance connector (e.g., a gate bus) still is used to help distribute current. The gate mesh may trade off a lower resistance for the gate connection with taking up space on the device for what would have been electrical ohmic contact to the source. Moreover, the additional gate fingers 134a, 134b may incorporate additional processing during manufacture and may utilize a large amount of the surface of the device.

In order to address the disadvantages of conventional devices, embodiments described herein provide gate connectors that allow for the reduction in gate resistance of the device in a simple manner. The gate connectors connect to a plurality of the gate fingers and/or one or more of the gate buses to allow for increased conductivity of the gate electrode. In some embodiments, portions of the gate connector may be integrated with the gate structure of one or more of the unit cell transistors of the device.

Figure 2A:
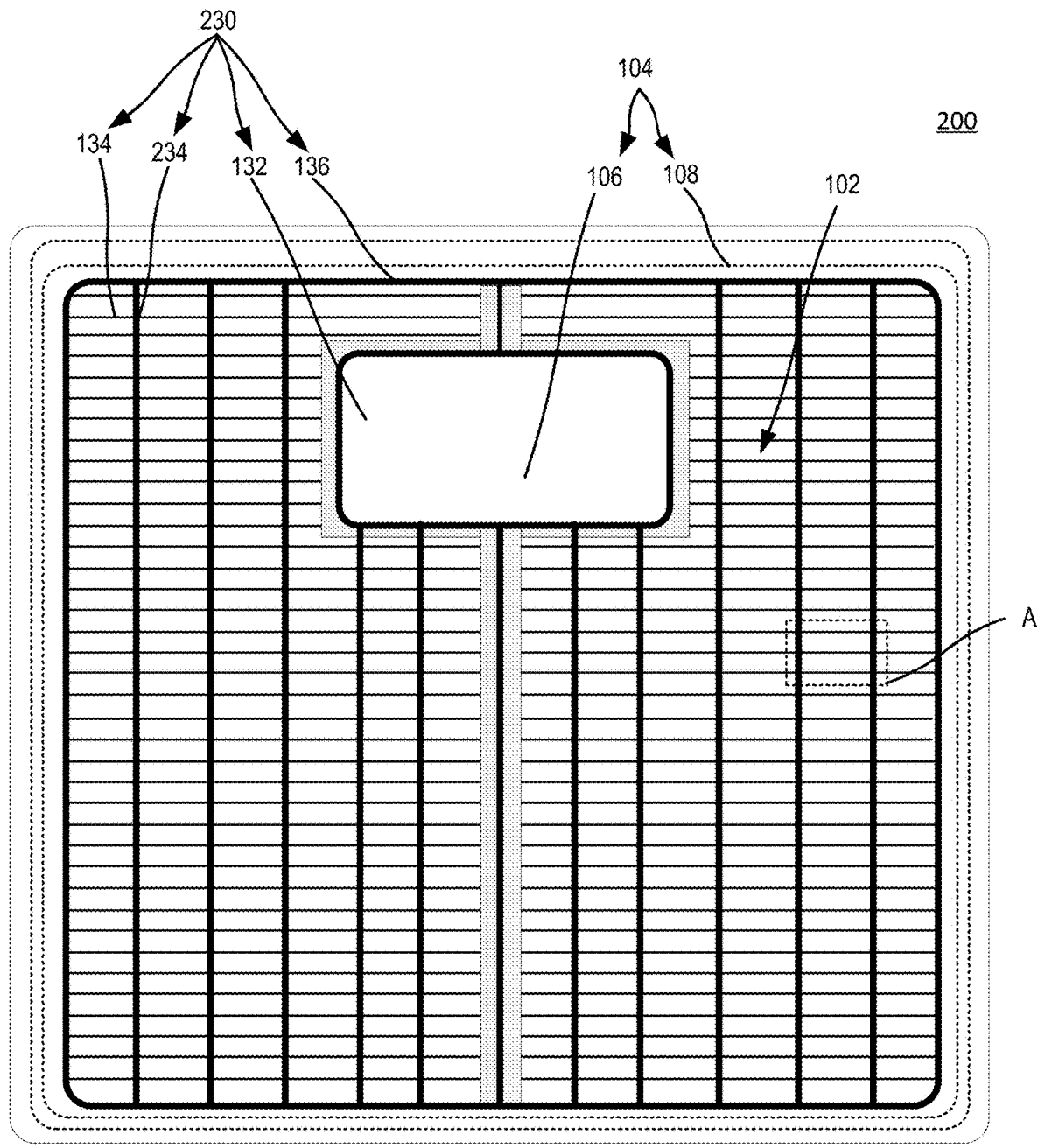
FIG. 2A is a schematic plan view of a power switching device according to some embodiments of the present disclosure.

FIG. 2A is a schematic plan view of a power switching device 200 according to some embodiments of the present disclosure. Referring to FIG. 2A, the power switching device 200 includes a semiconductor layer structure that includes an active region 102 and an inactive region 104. The active region 102 is an area of the device that includes operable transistors (e.g., the unit cell transistors discussed herein), while the inactive region 104 is an area that does not include such operable transistors. The power switching device 200 may share many similarities with the power switching device 100 discussed herein with respect to FIGS. 1A-1D. Accordingly, the description of FIG. 2A will focus on the differences with respect to FIGS. 1A-1D.

As illustrated in FIG. 2A, the gate electrode structure 230 may include the gate pad 132, the plurality of gate fingers 134, one or more gate buses 136, and one or more gate connectors 234 that electrically interconnect the gate fingers 134. The gate connectors 234 may comprise a metal and/or metal nitride such as, for example, titanium (Ti), titanium nitride (TiN), tantalum (Ta), tantalum nitride (TaN), and/or tungsten (W), though the present disclosure is not limited thereto.

As illustrated in FIG. 2A, the gate connectors 234 may be incorporated into the power switching device 200 to be on and/or contact one or more of the gate fingers 134. In some embodiments, the gate fingers 134 may extend in a first direction (e.g., an X direction in FIG. 2A), and the gate connectors 234 may extend in a second direction (e.g., a Y direction in FIG. 2A) that crosses the first direction. The gate connectors 234 may be connected to one or more gate buses 136. For example, the gate connectors 234 may be connected to a gate bus 136 at either end of the gate connector. In some embodiments, the gate connectors 234 may be electrically connected to the gate fingers 134 over which they traverse.

Though the gate connectors 234 are illustrated as extending from one side of the power switching device 200 to the other, it will be recognized that the present embodiments are not limited thereto. In some embodiments, one or more of the gate connectors 234 may be connected to a gate bus 136 and/or gate pad 132 at only one end of the gate connector 234. Similarly, in some embodiments, a gate connector 234 may not be connected to the gate bus 136 and/or gate pad 132, but may instead be connected to another gate connecter 234.

In addition, though the gate connectors 234 are illustrated as being distributed at regular intervals, the present embodiments are not limited thereto. In some embodiments, a density of the gate connectors 234 may vary in different locations on the power switching device 200.

Figure 2B:
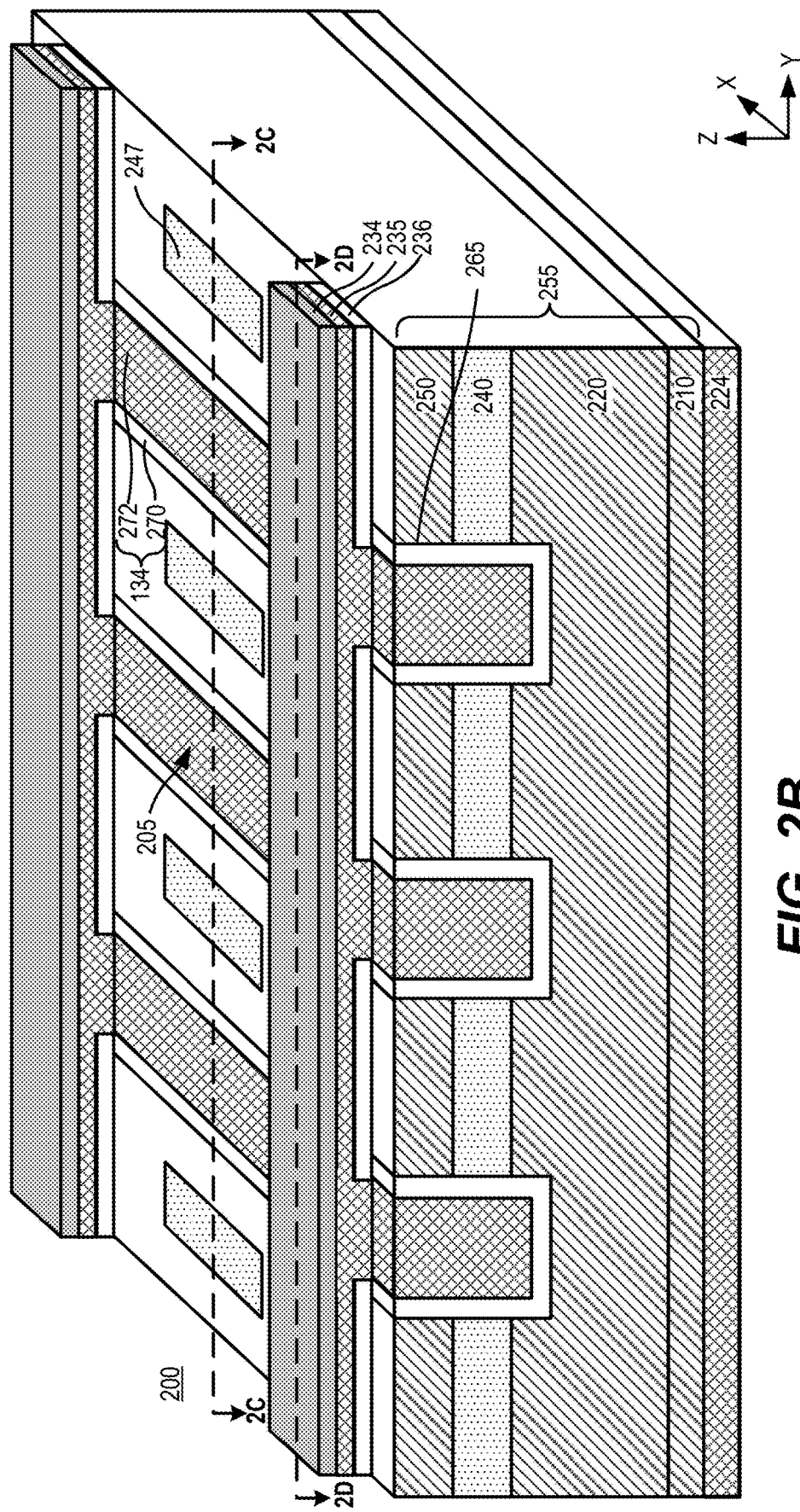
FIG. 2B is a schematic enlarged perspective view of section 'A' of FIG. 2A.
Figure 2C:
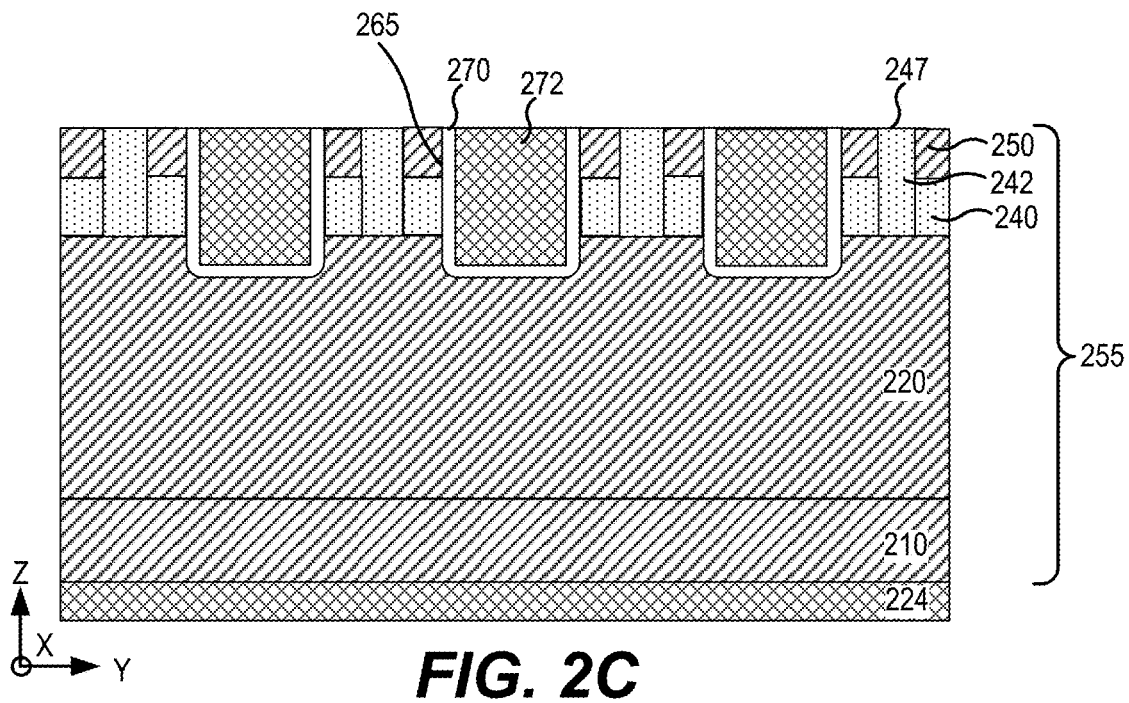
FIG. 2C is a schematic cross-sectional view taken along line 2C-2C of FIG. 2B.
Figure 2D:
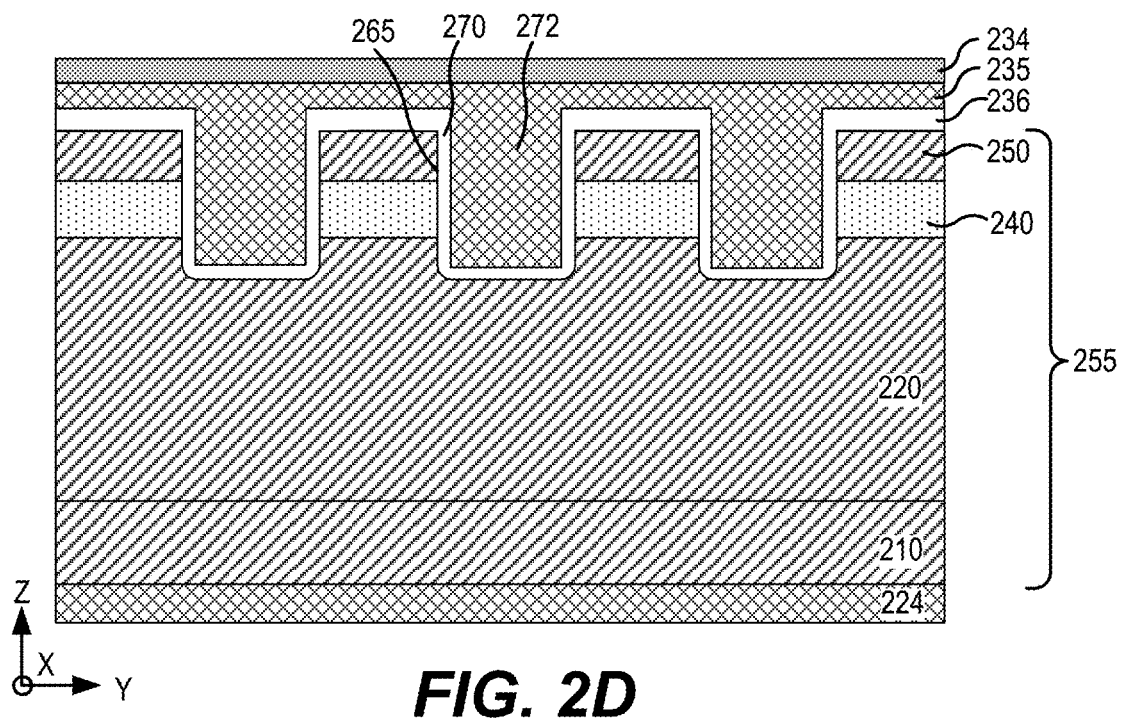
FIG. 2D is a schematic cross-sectional view taken along line 2D-2D of FIG. 2B.

To better describe the structure of the gate connectors 234, a subset of the power switching device 200 indicated by box 'A' will be described. FIG. 2B is a schematic enlarged perspective view of section 'A' of FIG. 2A. FIG. 2C is a schematic cross-sectional view taken along line 2C-2C of FIG. 2B. FIG. 2D is a schematic cross-sectional view taken along line 2D-2D of FIG. 2B.

Referring to FIGS. 2B to 2D, the power switching device 200 may include a plurality of unit cell transistors 205. The power switching device 200, and hence the unit cell 205, may include an n-type wide band-gap semiconductor substrate 210. The substrate 210 may comprise, for example, a 4H—SiC or 6H—SiC substrate. In other embodiments, the substrate 210 may be or comprise a different semiconductor material (e.g., a Group III nitride-based material, Si, GaAs, ZnO, InP) or a non-semiconductor material (e.g., sapphire). The substrate 210 may be heavily-doped with n-type impurities (i.e., an n$^+$ silicon carbide substrate). The impurities may comprise, for example, nitrogen or phosphorous. The doping concentration of the substrate 210 may be, for example, between $1\times10^{18}$ atoms/cm$^3$ and $1\times10^{21}$ atoms/cm$^3$, although other doping concentrations may be used. The substrate may be relatively thick in some embodiments (e.g., more than 100 microns), but is shown as a thin layer in FIGS. 2B-2D (and other figures) to allow enlargement of other layers and regions of the device.

A lightly-doped n-type (n) silicon carbide drift region 220 may be provided on the substrate 210. The n-type silicon carbide drift region 220 may be formed by, for example, epitaxial growth on the substrate 210. The n-type silicon carbide drift region 220 may have, for example, a doping concentration of $1\times10^{16}$ to $5\times10^{17}$ dopants/cm$^3$. The n-type silicon carbide drift region 220 may be a thick region, having a vertical height above the substrate 210 of, for example, 3-100 microns. In some embodiments, an upper portion of the n-type silicon carbide drift region 220 may comprise an n-type silicon carbide current spreading layer in some embodiments that is more heavily doped than the lower portion of the n-type silicon carbide drift region 220. In some embodiments, a p-type shielding region (not shown) may be formed in the drift region 220.

P-wells 240 may be formed on and/or in the drift region 220. In some embodiments, the p-wells 240 may have a doping concentration of, for example, between $5\times10^{16}$/cm$^3$ and $5\times10^{19}$/cm$^3$. An upper portion 242 (see FIG. 2C) of each p-well 240 may be more heavily doped with p-type dopants. The upper portion 242 of each p-well 240 may have a doping concentration of, for example, between $2\times10^{18}$/cm$^3$ and $1\times10^{20}$/cm$^3$.

Heavily-doped (n$^+$) n-type silicon carbide source/drain regions 250 may be formed in upper portions of the p-wells 240. The heavily-doped (n$^+$) n-type silicon carbide regions 250 may act as source regions for the unit cell transistor 205. The drift region 220 and the substrate 210 together act as a common drain region for the unit cell transistor 205.

In some embodiments, the p-wells 240 (including the more heavily-doped upper portions 242 thereof) and the n-type source/drain regions 250 may be formed via ion implantation in the drift layer 220. In some embodiments, the p-wells 240 may be formed of a layer deposited on the upper surface of the drift layer 220, into which the n-type source/drain regions 250 are implanted. As is known to those skilled in the art, ions such as n-type or p-type dopants may be implanted in a semiconductor layer or region by ionizing the desired ion species and accelerating the ions at a predetermined kinetic energy as an ion beam towards the surface of a semiconductor layer in an ion implantation target chamber. Based on the predetermined kinetic energy, the desired ion species may penetrate into the semiconductor layer to a certain depth. The p-wells 240 (including the more heavily-doped upper portions 242 thereof), n-type source/drain regions 250, drift region 220, and substrate 210 may form semiconductor layer structure 255.

A trench 265 may be formed in the drift layer 220. In some embodiments, a bottom surface of the trench 265 may extend below a bottom surface of the p-wells 240 and/or the source/drain regions 250 into the drift layer 220. A gate insulator 270 may be formed on the sidewalls and floor of the trench 265. The gate insulator 270 may comprise, for example, a silicon dioxide (SiO$_2$) layer, although other insulating materials, such as SiO$_x$N$_y$, Si$_x$N$_y$, Al$_2$O$_3$ and/or high-K dielectrics such as hafnium oxide, and the like may be used. A gate electrode 272 may be formed in the trench 265 on the gate insulator 270. The gate electrode 272 may include, for example, a silicide, doped polycrystalline silicon (poly-Si or poly), and/or a stable conductor. The gate insulator 270 and gate electrode 272 may be formed within the trench 265 in the drift layer 220 between the p-wells 240 and n-type source/drain regions 250 and, in some embodiments, may extend onto the surface of the drift layer 220. In some embodiments, a portion of an upper surface of the gate insulator 270 and a portion of an upper surface of the gate electrode 272 may be coplanar with an upper surface of the semiconductor layer structure 255, though the embodiments described herein are not limited thereto. It will be appreciated that the gate electrode 272 may be part of gate finger 134 of a continuous gate electrode structure 230 (see FIG. 2A) that includes a gate pad 132 and one or more gate buses 136. In some embodiments, the gate electrode structure 230 may comprise, for example, a semiconductor (e.g., polysilicon) and/or a metal.

Since, in the gate trench implementation illustrated in FIGS. 2A to 2D, the gate electrode 272 penetrates into the upper surface of the semiconductor layer structure 255, the application of a bias to the gate electrode 272 forms a vertical channel that extends through the portion of the p-wells 240 that are underneath the n-type source/drain regions 250.

Portion 247 of the p-well 240 (e.g., the more heavily-doped upper portions 242 thereof) may expose a surface to which a surface contact (not shown) can be attached. For example, the surface contact may comprise a metal and may form a source contact of the power switching device 200. As described above with reference to FIGS. 2A-2B, the source contacts may be part of a continuous source metal layer 123 that extends across the upper surface of the silicon carbide semiconductor layer structure 255. The source metal layer (as well as the insulating layer that electrically isolates the gate electrode 272 from the source metal layer) is not shown in FIGS. 2A to 2D to simplify the drawings. The source contacts may comprise, for example, metals such as nickel, titanium, tungsten or aluminum, or alloys or thin layered stacks of these or similar materials. A drain contact 224 may be formed on the lower surface of the substrate 210. The drain contact 224 may comprise, for example, similar materials to the source contact, which may form an ohmic contact to the substrate 210. Current may flow from the n-type source regions 250 through the drift region 220 that is adjacent and underneath the gate electrode 272 when a voltage is applied to the gate electrode 272.

A plurality of gate connectors 234 may extend perpendicularly to the gate finger 134. The plurality of gate connectors 234 may be separated from one another in a direction that is parallel to the gate finger 134. For example, as illustrated in FIGS. 2B and 2D, the gate fingers 134 may extend in an X direction and the plurality of gate connectors 234 may extend in the Y direction. The plurality of gate connectors 234 may be arranged in the X direction to periodically be on and/or directly contact the gate fingers 134. The gate connector 234 may extend on and/or directly contact adjacent ones of the gate electrodes 272 and a given gate electrode 272 may be connected to and/or contact more than one gate connector 234. The gate connector 234 may comprise a metal and/or metal nitride such as, for example, titanium (Ti), titanium nitride (TiN), tantalum (Ta), tantalum nitride (TaN), and/or tungsten (W), though the present disclosure is not limited thereto. The gate connector 234 may be formed as a single layer or multiple layers. The thickness of the gate connector 234 may be between 10 nm to 500 nm.

In some embodiments, one or more layers may separate the gate connector 234 from a top surface of the semiconductor layer structure 255. Portions of the gate connector 234 may be insulated from the semiconductor layer structure 255 below. For example, in some embodiments a connector insulating layer 236 may be disposed between the gate connector 234 and top surface of the semiconductor layer structure 255. The connector insulating layer 236 may comprise, for example, a silicon dioxide ($SiO_2$) layer, although other insulating materials, such as $SiO_xN_y$, $Si_xN_y$, $Al_2O_3$ and/or high-K dielectrics such as hafnium oxide, and the like may be used. In some embodiments, the connector insulating layer 236 may be physically connected to and/or integral with the gate insulator 270. Thus, the gate insulator 270 and the connector insulating layer 236 may form a continuous layer, with portions of the gate insulator 270 on the sidewalls and bottom of the trench 265 and portions of the connector insulating layer 236 extending on the surface of the semiconductor layer structure 255. The thickness of the connector insulator layer 236 may be between 25 nm to 75 nm. In some embodiments, the connector insulator layer 236 may be equal to or greater in thickness than the gate insulator 270. In some embodiments, the connector insulator layer 236 may be may be composed of a same material as the gate insulator 270 and/or may include additional dielectrics applied either before or after the gate insulator 270.

In some embodiments, a connector electrode layer 235 may be disposed between the gate connector 234 and the connector insulating layer 236. The connector electrode layer 235 may comprise, for example, a silicide, doped polycrystalline silicon (poly-Si or poly), and/or a stable conductor. The connector electrode layer 235 may reduce an interaction between the connector insulating layer 236 and the gate connector 234. In some embodiments, the connector electrode layer 235 may be physically connected to and/or integral with the gate electrode 272. In some embodiments, the connector electrode layer 235 may be composed of a same material as the gate electrode 272. In some embodiments, the connector electrode layer 235 may contact a portion of the gate electrode 272 that extends above a top surface of the semiconductor layer structure 255. The thickness of the connector electrode layer 235 may be between 25 nm to 800 nm. Thus, the gate electrode 272 and the connector electrode layer 235 may form a continuous layer, with portions of the gate electrode 272 on and/or within the trench 265 and portions of the connector electrode layer 235 extending on the surface of the semiconductor layer structure 255 and on the connector insulating layer 236.

The power switching device 200 may include poly Si or silicide as the gate electrode 272 due to processing operations after the gate is formed that utilize high temperatures. Since silicon is chemically inert at the interface with the gate insulator 270, it may be utilized as part of the gate finger 134 to form a higher quality gate electrode. However, poly Si may have a higher resistance than other metals. For example, the conductivity of the material comprising the gate connector 234 may be higher than a conductivity of a material comprising the gate finger 134 (or conversely, the resistivity of the material comprising the gate finger 134 may be higher than the resistivity of the material comprising the gate connector 234). By incorporating an additional gate connector 234, e.g., so that the gate connector 234 contacts the gate electrode 272, the resistance of the gate electrode structure 230 may be reduced. In trenched devices, if the trench is made very narrow and shallow, the volume of gate electrode 272 may be very small in the trench. Thus, including a more conductive metal in the gate connector 234 can be helpful for these devices.

While power switching device 200 is illustrated as an n-type device with the source regions 250 on an upper surface thereof and the drain contact 224 on the bottom surface thereof, it will be appreciated that in p-type devices these locations are reversed. Accordingly, in portions of the descriptions below (including the claims) the source contacts and drain contacts may generically refer to either a source contact or a drain contact.

Figure 2E:
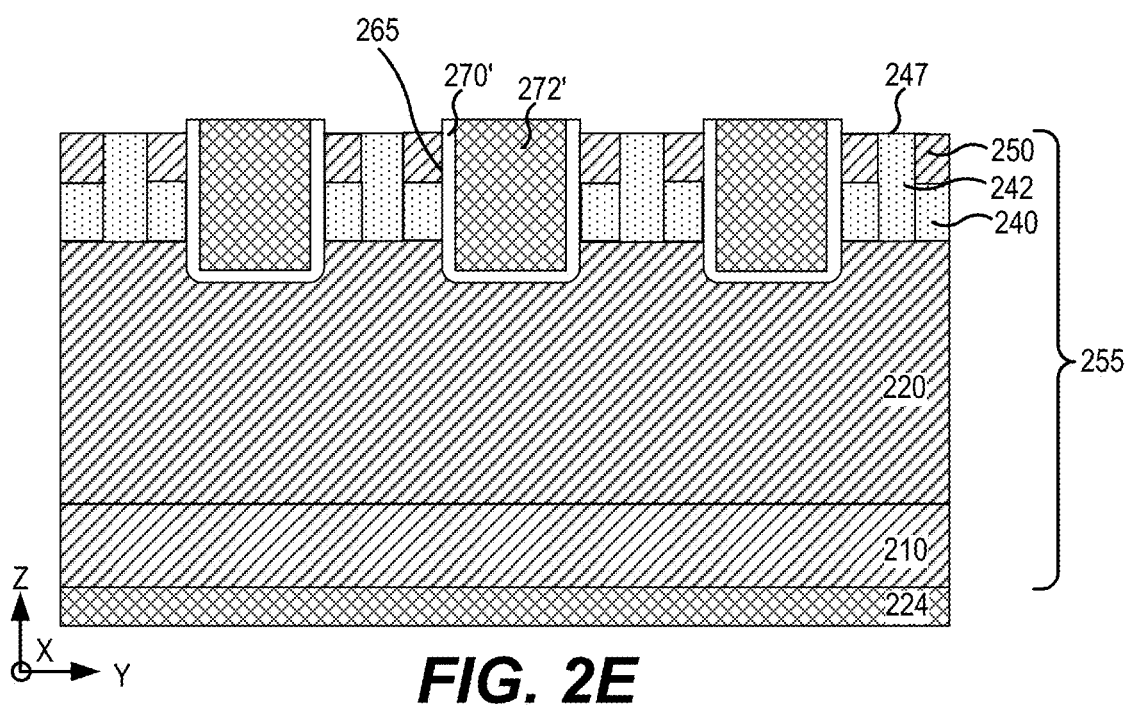
FIG. 2E is a schematic cross-sectional view of an additional configuration of a gate electrode according to some embodiments of the present disclosure.

As noted above, in some embodiments, a portion of an upper surface of the gate insulator 270 and a portion of an upper surface of the gate electrode 272 may be coplanar with an upper surface of the semiconductor layer structure 255, such as that illustrated in FIG. 2C. However, in some embodiments, the upper surface of the gate electrode 272 may extend above an upper surface of the semiconductor layer structure 255. FIG. 2E is a schematic cross-sectional view taken from a similar perspective as FIG. 2C (e.g., along the line 2C-2C) but illustrating an alternative configuration of the gate electrode 272' and the gate insulator 270'. As illustrated in FIG. 2E, in some embodiments, the gate electrode 272' and the gate insulator 270' may be formed such that at least a portion of the gate electrode 272' and/or the gate insulator 270' are at a level higher (e.g., farther from the substrate 210) than an upper surface of the semiconductor structure 255. In other respects, the configuration of the device in FIG. 2E may be substantially similar to that of the device illustrated in FIGS. 2A to 2D. In will be understood that other configurations of the gate electrode 272' and/or the gate insulator 270' may be possible without deviating from the present invention.

Figure 3A:
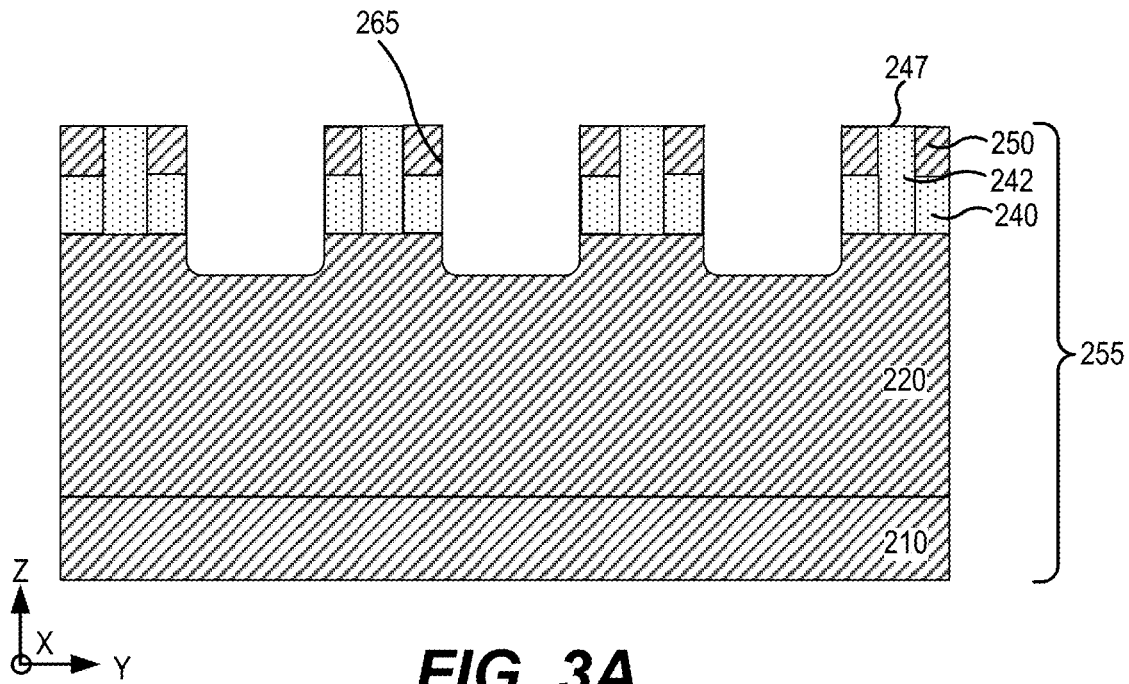
FIGS. 3A to 3F are schematic cross-sectional views illustrating methods of manufacturing the power switching device of FIGS. 2A to 2D according to some embodiments of the present disclosure.
Figure 3B:
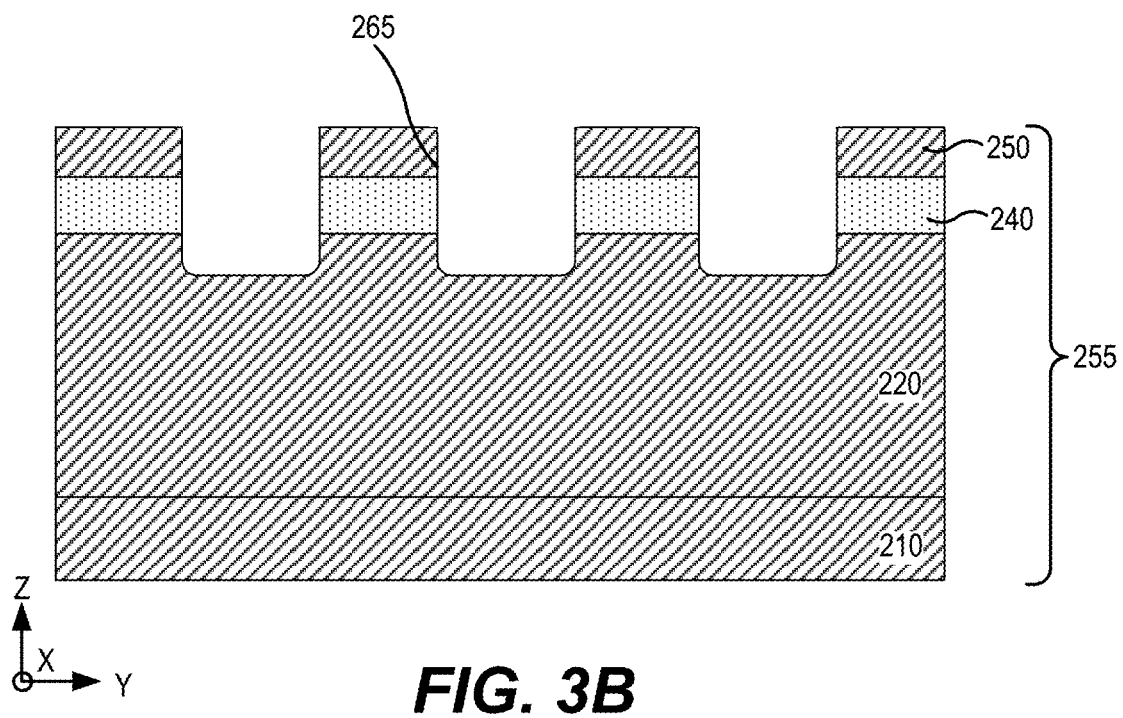
Figure 3C:
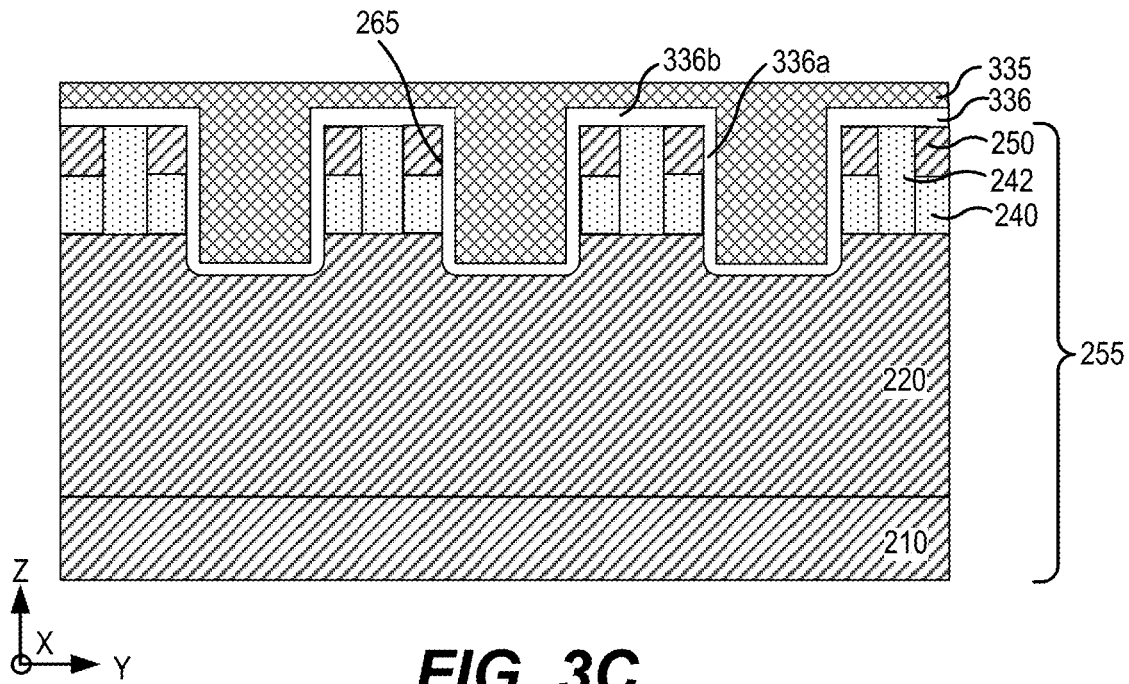
Figure 3D:
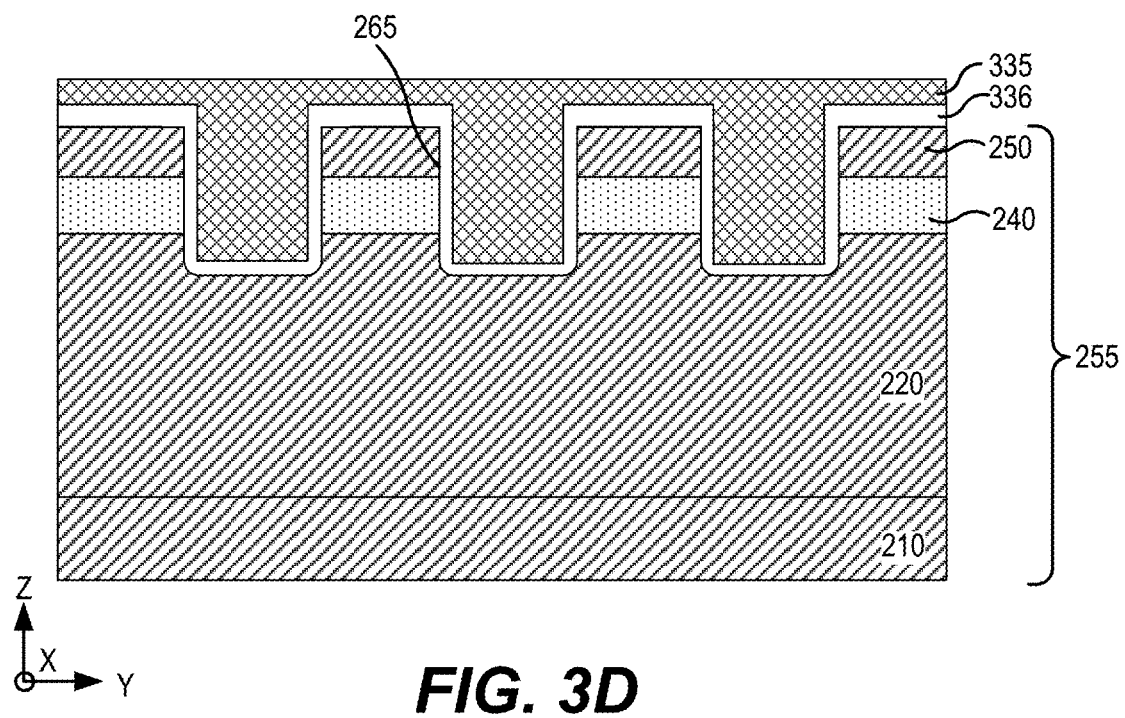
Figure 3E:
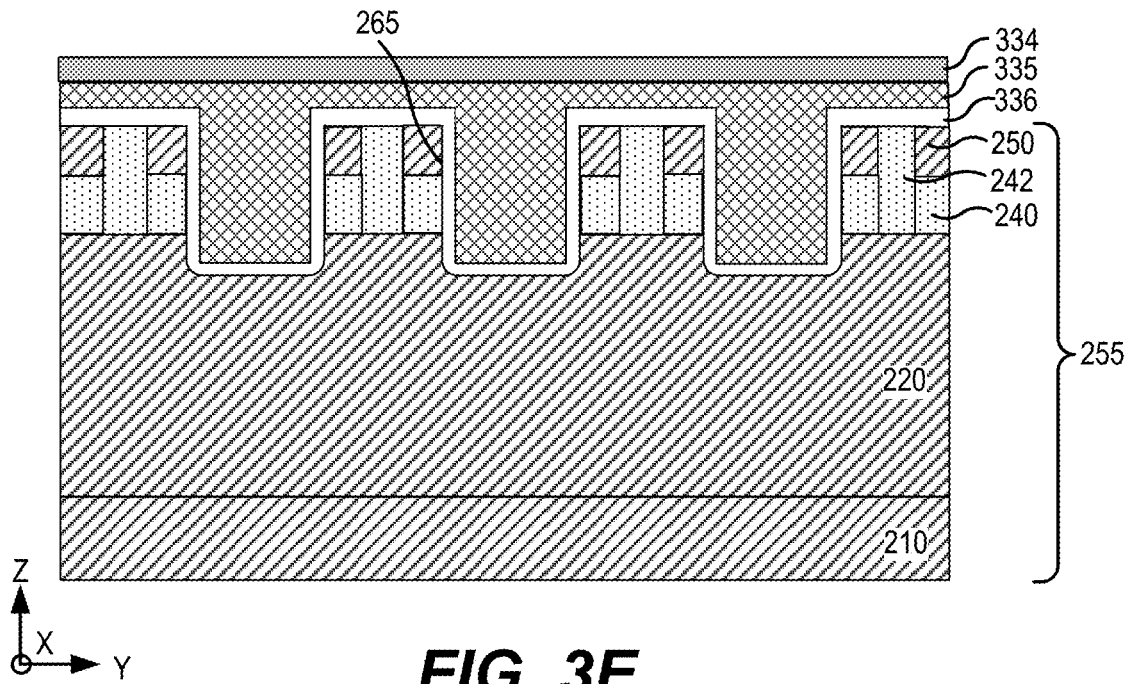
Figure 3F:
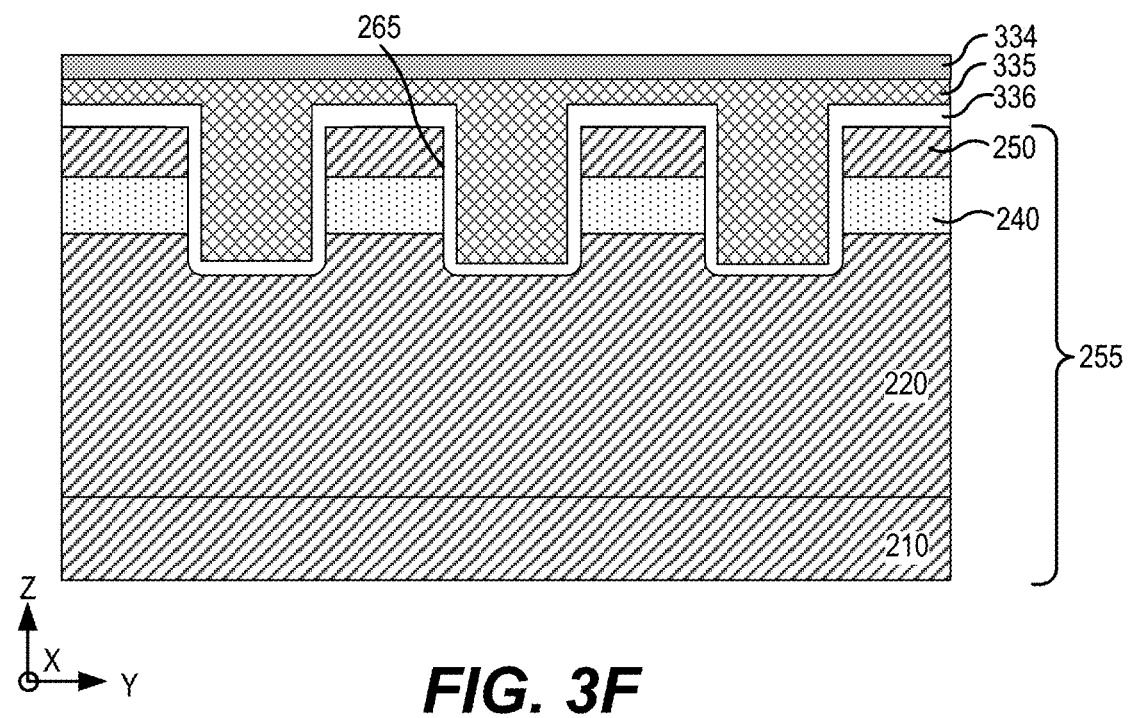

FIGS. 3A to 3F are schematic cross-sectional views illustrating methods of manufacturing the power switching device 200 of FIGS. 2A to 2D according to some embodiments of the present disclosure. FIGS. 3A, 3C, and 3E are cross-sections taken along the line 2C-2C of FIG. 2B. FIGS. 3B, 3D, and 3F are cross-sections taken along the line 2D-2D of FIG. 2B. A description of those elements of FIGS. 3A to 3F that are the same or similar to those of FIGS. 2A to 2D will be omitted for brevity. Accordingly, the description of FIGS. 3A to 3F will focus on differences with the devices previously described.

Referring to FIGS. 3A and 3B, a substrate 210 is provided and a drift region 220 is formed on the substrate 210 via epitaxial growth. In some embodiments, the substrate 210 is a heavily-doped (n$^+$) n-type silicon carbide and the drift region 220 is a lightly-doped (n) silicon carbide drift region 220. In some embodiments, an n-type silicon carbide current spreading layer may be formed that comprises the upper portion of the drift layer 220.

P-wells 240 may be formed in what will be the active region 102 of the final device. In the active region 102, an upper portion 242 of each p-well 240 may be more heavily doped with p-type dopants, and heavily-doped (n$^+$) n-type silicon carbide source regions 250 may be formed in upper portions of the p-wells 240 directly adjacent and contacting the more heavily doped portions 242 of the p-wells 240. The heavily-doped (n$^+$) n-type silicon carbide regions 250 act as source regions for the unit cell transistor 205. In some embodiments, ion implantation may be used to form the p-wells 240, 242, and the n-type source regions 250. The p-wells 240 (including the more heavily-doped upper portions 242 thereof), n-type source/drain regions 250, drift region 220, and substrate 210 may form semiconductor layer structure 255. The semiconductor layer structure 255 may be patterned and etched to form trenches 265.

Referring to FIGS. 3C and 3D, a gate insulating layer 336 may be formed on the upper surface of the semiconductor layer structure 255 and in the trenches 265. In some embodiments, first portions 336a of the gate insulating layer 336 may be formed (e.g., deposited and/or grown) on the sidewalls and bottom of the trench 265. In some embodiments, second portions 336b of the gate insulating layer 336 may be formed (e.g., deposited and/or grown) on the semiconductor layer structure 255 between the trenches 265. In some embodiments, the first and second portions 336a, 336b of the gate insulating layer 336 may be physically connected to one another. The gate insulating layer 336 may comprise, for example, a silicon dioxide (SiO$_2$) layer, although other insulating materials, such as SiO$_x$N$_y$, Si$_x$N$_y$, Al$_2$O$_3$ and/or high-K dielectrics such as hafnium oxide, and the like may be used. In some embodiments, a composition of the first portion 336a of the gate insulating layer 336 may be different from the second portion 336b. For example, the second portion 336b of the gate insulating layer 336 may include additional dielectric layers that are applied either before or after the material used to form the first portion 336a of the gate insulating layer 336.

An electrode layer 335 may be formed on the gate insulating layer 336. The electrode layer 335 may also be formed within, and in some embodiments fill, the trench 265. The electrode layer 335 may include, for example, a silicide, doped polycrystalline silicon (poly-Si or poly), and/or a stable conductor.

Referring to FIGS. 3E and 3F, a gate connector layer 334 may be formed on the upper surface of the electrode layer 335 and the gate insulating layer 336. In some embodiments, the gate connector layer 334 may be deposited as a blanket layer. The gate connector layer 334 may comprise a metal and/or metal nitride such as, for example, Ti, TiN, Ta, TaN, and/or W, though the present disclosure is not limited thereto. The gate connector layer 334 may be formed as a single layer or multiple layers. The gate connector layer 334 may be formed in a single step or multiple steps. The thickness of the gate connector layer 334 may be, for example, between 10 nm to 500 nm.

Referring back to FIGS. 2B to 2D, the gate connector layer 334, the electrode layer 335, and the gate insulating layer 336 may be patterned and etched to form the gate connectors 234, the connector electrode layer 235, the connector insulating layer 236, the gate insulator 270, and the gate electrode 272. For example, the gate connector layer 334, the electrode layer 335, and the gate insulating layer 336 may be patterned so as to leave a plurality of portions of the gate connector layer 334, the electrode layer 335, and the gate insulating layer 336 extending perpendicularly to the trenches 265. The remaining portions of the gate connector layer 334, the electrode layer 335, and the gate insulating layer 336 may form the gate connectors 234, the connector electrode layer 235, and the connector insulating layer 236. The connector electrode layer 235 may be physically connected to and/or integral with the gate electrode 272. The connector insulating layer 236 may be physically connected to and/or integral with the gate insulator 270.

Portions of the gate connector layer 334, the electrode layer 335, and the gate insulating layer 336 may be removed in other portions of the active area 102. For example, over the area in which the source contacts are to be formed, portions of the gate connector layer 334, the electrode layer 335, and the gate insulating layer 336 on the top surface of the semiconductor layer structure 255 may be removed to expose the top surface of the semiconductor layer structure 255. Conventional processing may proceed from this point to provide source and/or drain contacts (e.g., drain contact 224). In areas of the active area 102 separate from the gate connectors 234, the electrode layer 335 and the gate insulating layer 336 may be removed to form a gate electrode 272 and gate insulator 270 having upper surfaces that are coplanar with the upper surface of the semiconductor layer structure 255, however the embodiments described herein are not limited thereto. In some embodiments, the gate electrode 272 and/or the gate insulator 270 may extend above the upper surface of the semiconductor layer structure 255 (e.g., as a "T-gate" or other configuration, such as that of FIG. 2E).

Figure 4A:
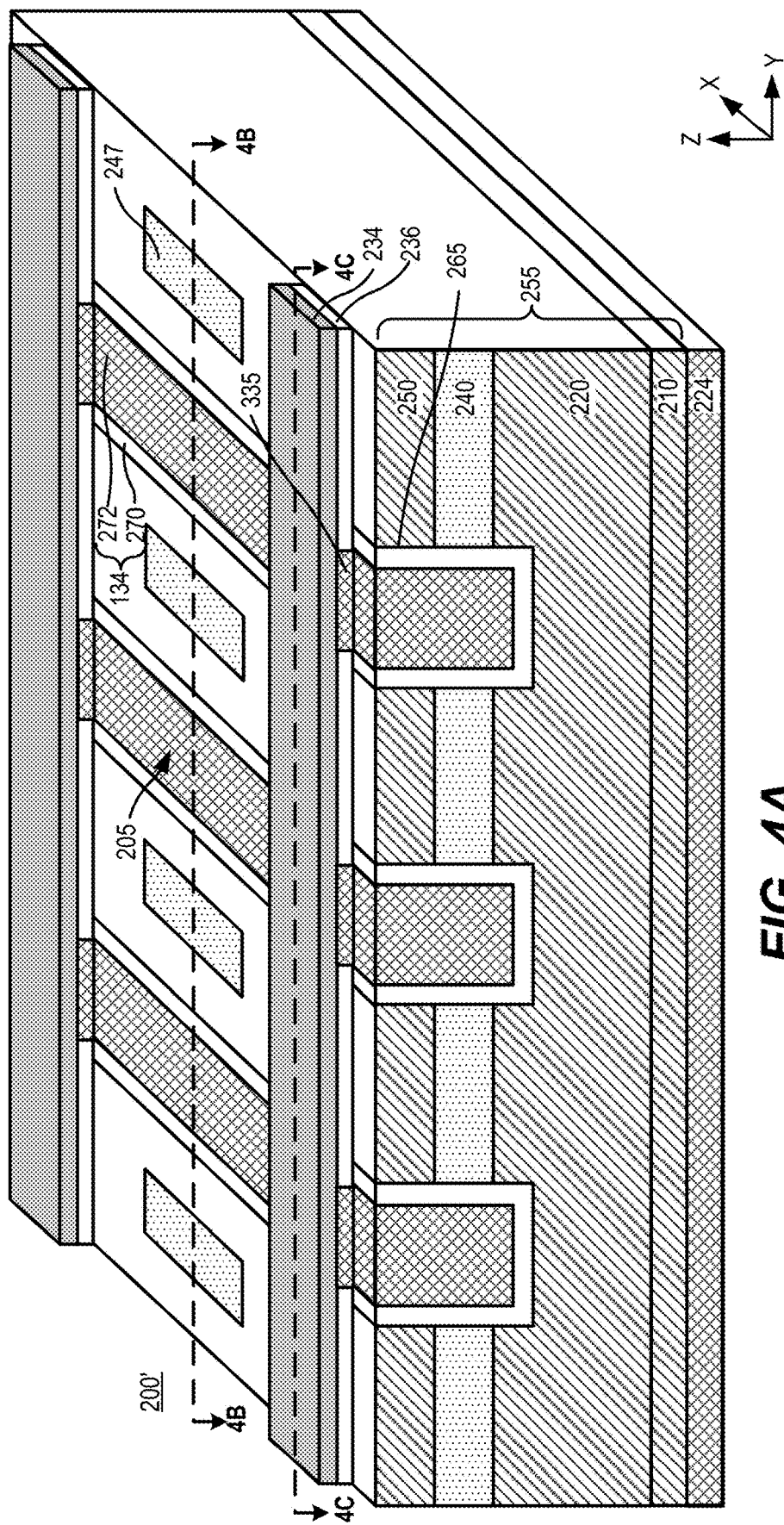
FIG. 4A is a schematic perspective view of a portion of a power switching device according to some embodiments of the present disclosure.
Figure 4B:
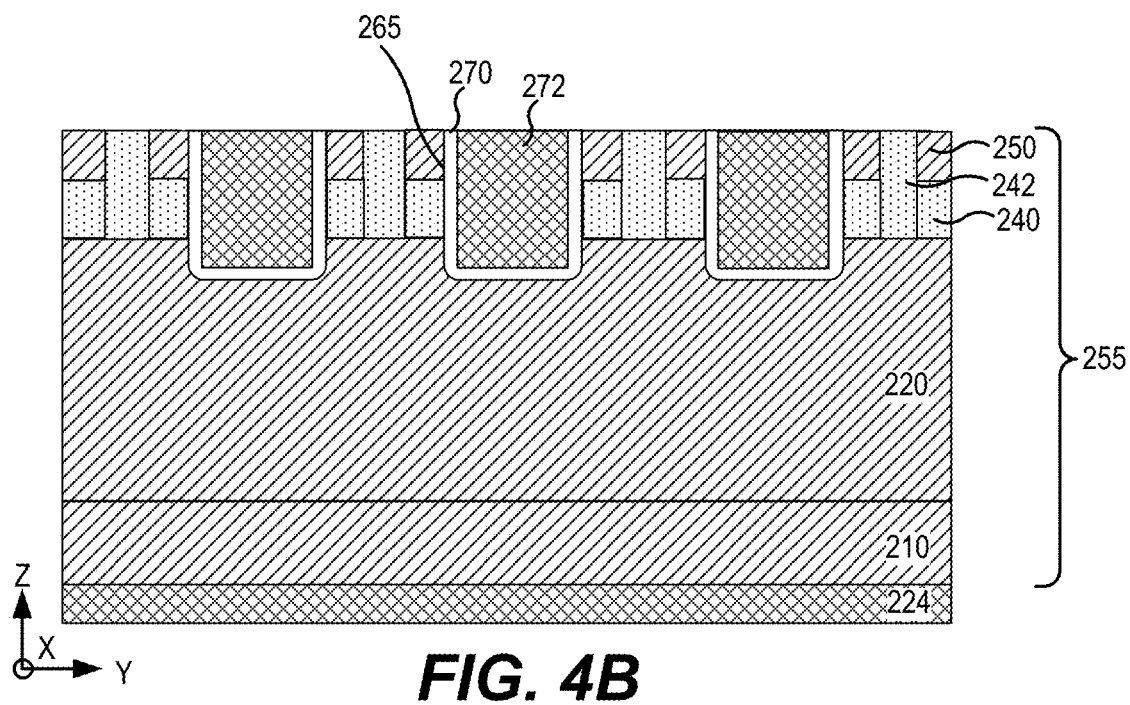
FIG. 4B is a schematic cross-sectional view taken along line 4B-4B of FIG. 4A.
Figure 4C:
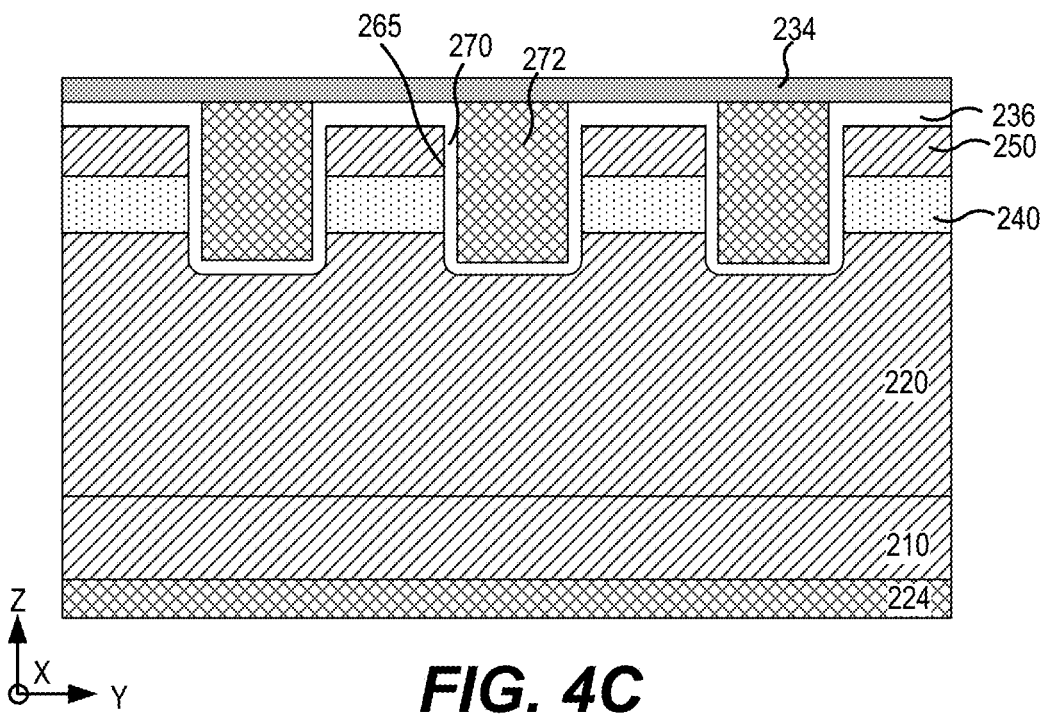
FIG. 4C is a schematic cross-sectional view taken along line 4C-4C of FIG. 4A.

FIG. 4A is a schematic perspective view of a portion of a power switching device 200' according to some embodiments of the present disclosure. FIG. 4B is a schematic cross-sectional view taken along line 4B-4B of FIG. 4A. FIG. 4C is a schematic cross-sectional view taken along line 4C-4C of FIG. 4A. A description of those elements of FIGS. 4A to 4C that are the same or similar to those described in previous figures will be omitted for brevity. Accordingly, the description of FIGS. 4A to 4C will focus on differences with the devices previously described.

Referring to FIGS. 4A to 4C, the gate connector 234 may be separated from the top surface of the semiconductor layer structure 255 by the connector insulating layer 236. The connector electrode layer 235 may be absent from between the gate connector 234 and the connector insulating layer 236 but may be between the gate connector 234 and the gate electrode 272. In some embodiments, the gate electrode 272 may extend through the connector insulating layer 236 under the gate connector 234 to contact the gate connector 234. In some embodiments, the gate electrode 272 may extend above a top surface of the semiconductor layer structure 255 in an area below the gate connector 234. For example, a remnant of a deposited electrode layer 335 (see FIG. 5B) may remain as an upper portion of the gate electrode 272.

Figure 5A:
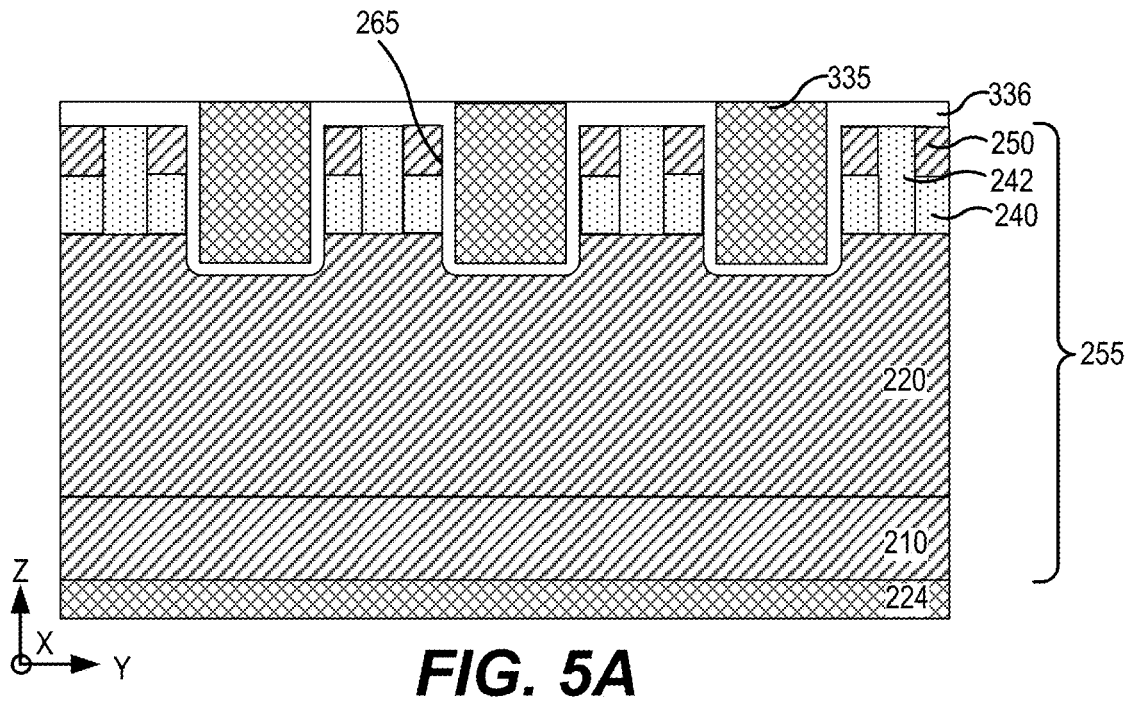
FIGS. 5A to 5D are schematic cross-sectional views illustrating methods of manufacturing the power switching device of FIGS. 4A to 4C according to some embodiments of the present disclosure.
Figure 5B:
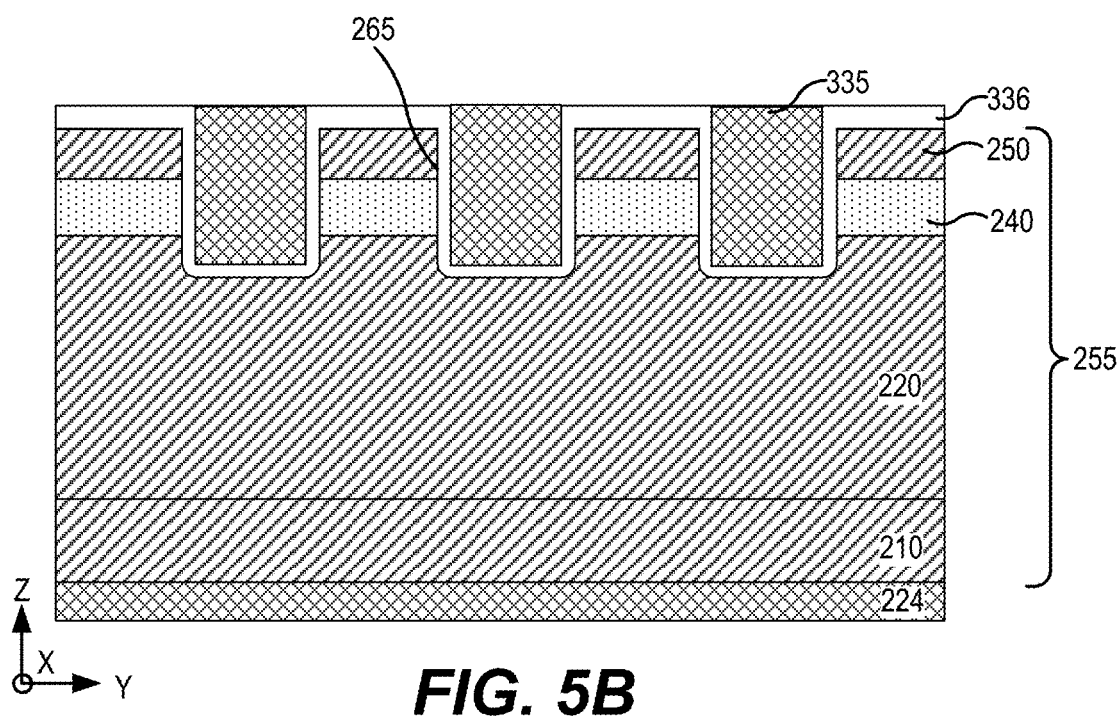
Figure 5C:
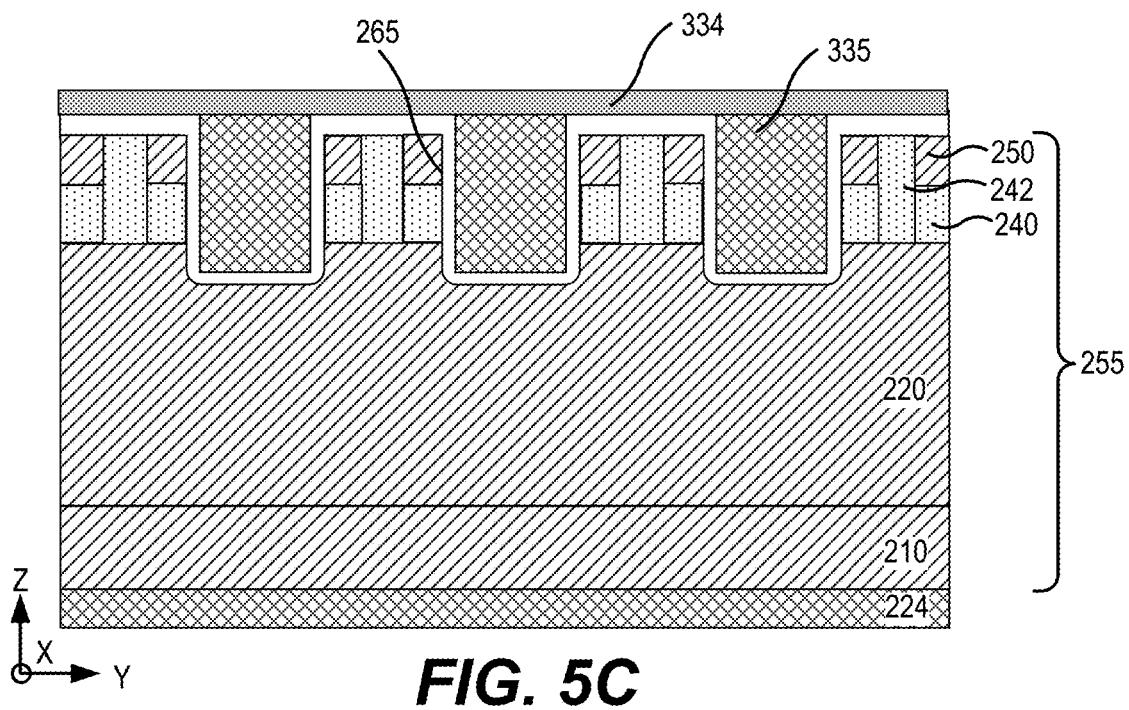
Figure 5D:
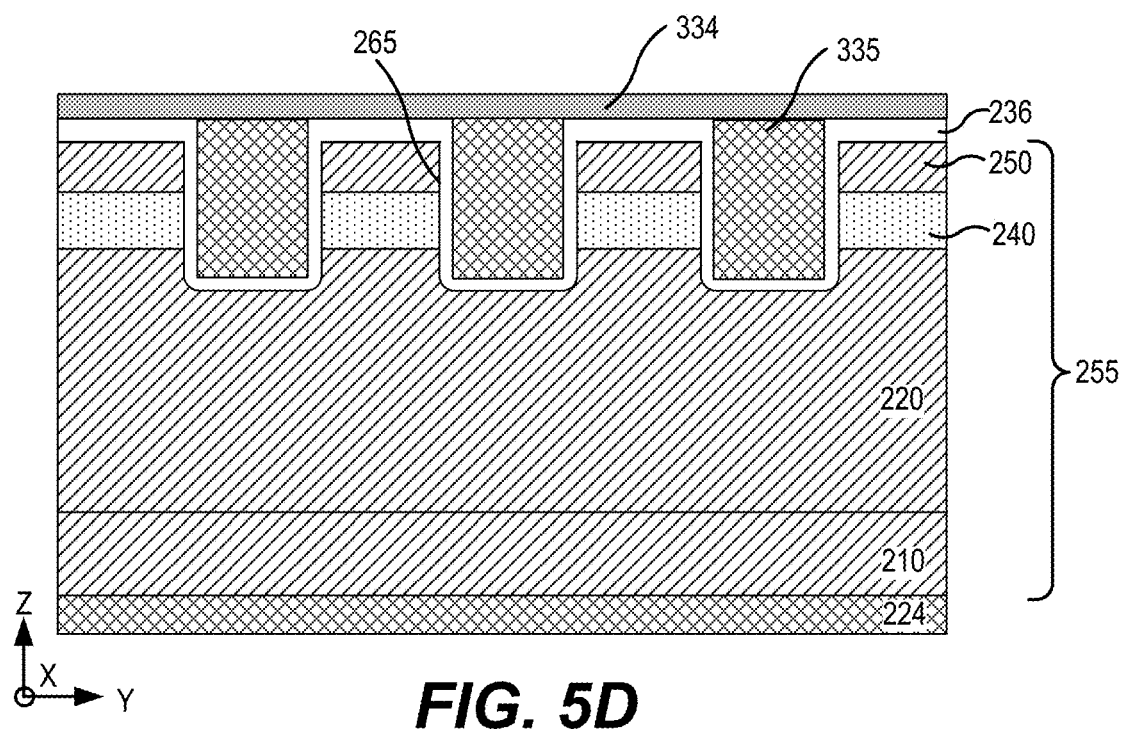

FIGS. 5A to 5D are schematic cross-sectional views illustrating methods of manufacturing the power switching device 200' of FIGS. 4A to 4C according to some embodiments of the present disclosure. FIGS. 5A and 5C are cross-sections along the line 4B-4B of FIG. 4A (e.g., along the exposed portions 247 of the p-well 242). FIGS. 5B and 5D are cross-sections taken from a same perspective as the line 4C-4C of FIG. 4A (e.g., along the gate connector 234). A description of those elements of FIGS. 5A to 5D that are the same or similar to those of previously-described figures will be omitted for brevity. Accordingly, the description of FIGS. 5A to 5D will focus on differences with the devices and/or methods previously described.

Initial steps to form the power switching device 200' of FIGS. 4A to 4C may be similar to those illustrated and described with respect to FIGS. 3A to 3D, and a duplicate description thereof will be omitted.

Referring to FIGS. 5A and 5B, the electrode layer 335 may be removed from upper surfaces of the gate insulating layer 336. For example, the electrode layer 335 may be planarized and/or patterned/etched to leave portions of the electrode layer 335 on the trenches 265. The electrode layer 335 may be planarized to leave a portion of the electrode layer 335 between portions of the gate insulating layer 336. For example, in some embodiments, an upper surface of the electrode layer 335 may be coplanar with an upper surface of the gate insulating layer 336, though the embodiments described herein are not limited thereto. The electrode layer 335 may form an upper portion of the gate electrode 272 (see FIGS. 4A and 4C).

Referring to FIGS. 5C and 5D, a gate connector layer 334 may be formed on the upper surface of the electrode layer 335 and the gate insulating layer 336. In some embodiments, the gate connector layer 334 may be deposited as a blanket layer. The gate connector layer 334 may comprise a metal and/or metal nitride such as, for example, Ti, TiN, Ta, TaN, and/or W, though the present disclosure is not limited thereto. The gate connector layer 334 may be formed as a single layer or multiple layers. The gate connector layer 334 may be formed in a single step or multiple steps. The thickness of the gate connector layer 334 may be between 10 nm to 500 nm.

Referring back to FIGS. 4A to 4C, the gate connector layer 334, the electrode layer 335, and the gate insulating layer 336 may be patterned and etched to form the gate connectors 234, the connector insulating layer 236, the gate insulator 270, and the gate electrode 272. For example, the gate connector layer 334, the electrode layer 335, and the gate insulating layer 336 may be patterned so as to leave a plurality of portions of the gate connector layer 334, the electrode layer 335, and the gate insulating layer 336 extending perpendicularly to the trenches 265. The remaining portions of the gate connector layer 334, the electrode layer 335, and the gate insulating layer 336 may form the gate connectors 234, and the connector insulating layer 236. The connector insulating layer 236 may be physically connected to and/or integral with the gate insulator 270. At least a portion of the gate connector 234 may be directly on the connector insulating layer 236 without the connector electrode layer 235 therebetween.

Portions of the gate connector layer 334, the electrode layer 335, and the gate insulating layer 336 may be removed in other portions of the active area 102. For example, over the area in which the source contacts are to be formed, the gate connector layer 334, the electrode layer 335, and the gate insulating layer 336 may be removed to expose the top surface of the semiconductor layer structure 255. Conventional processing may proceed from this point to provide source and/or drain contacts (e.g., drain contact 224). In areas of the active area 102 separate from the gate connectors 234, the electrode layer 335 and the gate insulating layer 336 may be removed to form a gate electrode 272 and gate insulator 270 having upper surfaces that are coplanar with the upper surface of the semiconductor layer structure 255, however the embodiments described herein are not limited thereto. In some embodiments, the gate electrode 272 and/or the gate insulator 270 may extend above the upper surface of the semiconductor layer structure 255 (e.g., as a "T-gate" or other configuration, such as that of FIG. 2E).

Figure 6A:
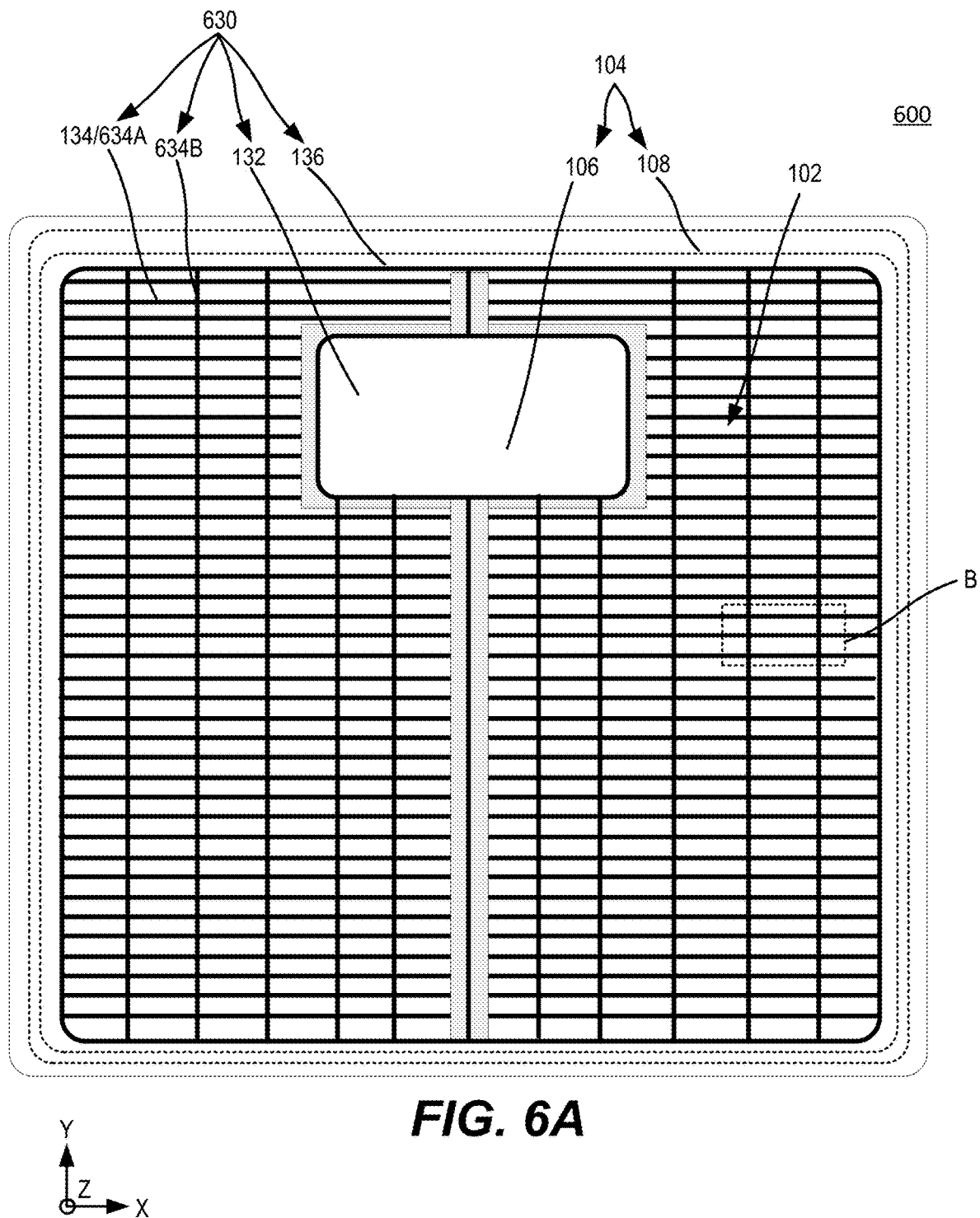
FIG. 6A is a schematic plan view of a power switching device according to some embodiments of the present disclosure.

FIG. 6A is a schematic plan view of a power switching device 600 according to some embodiments of the present disclosure. Referring to FIG. 6A, the power switching device 600 includes a semiconductor layer structure that includes an active region 102 and an inactive region 104. The power switching device 600 may share many similarities with the power switching device 200 discussed herein with respect to FIGS. 2A-2D. Accordingly, the description of FIGS. 6A to 6D will focus on the differences with respect to FIGS. 2A-2D.

As illustrated in FIG. 6A, the gate electrode 630 may include the gate pad 132, the plurality of gate fingers 134, one or more gate buses 136, and one or more gate connectors 634A, 634B that electrically interconnect the gate fingers 134. The gate connectors 634B may be disposed on a surface of the power switching device 600 in the second direction (e.g., the Y direction of FIG. 6A) to be on and/or contact one or more of the gate fingers 134 as in FIGS. 2A-2D. In addition, gate connectors 634A may extend in the first direction (e.g., the X direction of FIG. 6A) on, and in some embodiments, may cover, a surface of the gate fingers 134. The gate connector 634A and gate connector 634B may be collectively referred to herein as gate connector 634. Thus, the plurality of gate connectors 634 may include a first portion of gate connectors 634A extending in a first direction (e.g., an X direction in FIG. 6A) and a second portion of gate connectors 634B extending in a second direction that crosses the first direction (e.g., a Y direction in FIG. 6A).

The gate connectors 634 may be connected to one or more gate buses 136. For example, the gate connectors 634 may be connected to a gate bus 136 at either end of the gate connector 634. In some embodiments, the gate connectors 634 may be electrically connected to the gate fingers 134 over which they traverse.

Figure 6B:
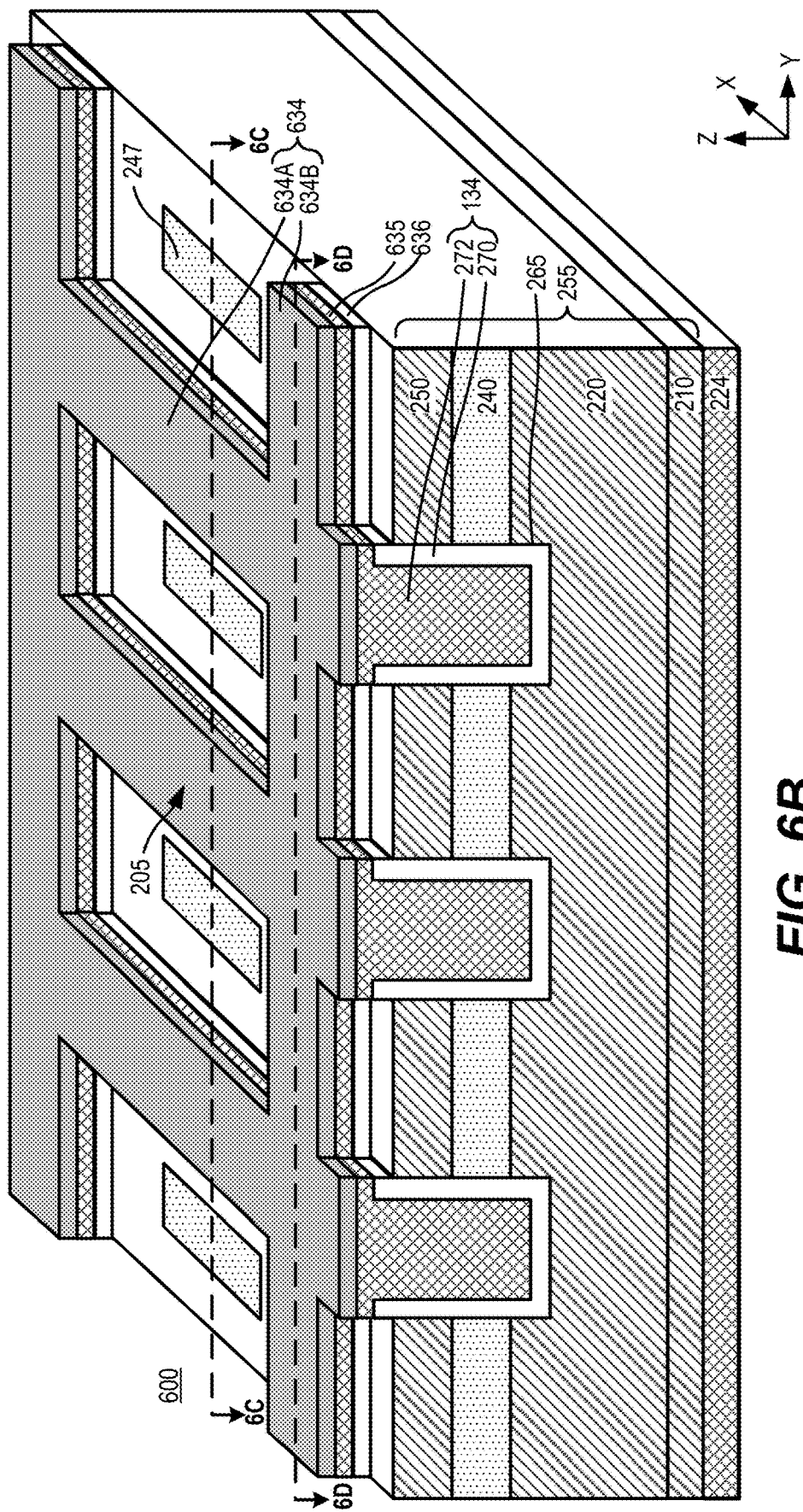
FIG. 6B is a schematic enlarged perspective view of section 'B' of FIG. 6A.
Figure 6C:
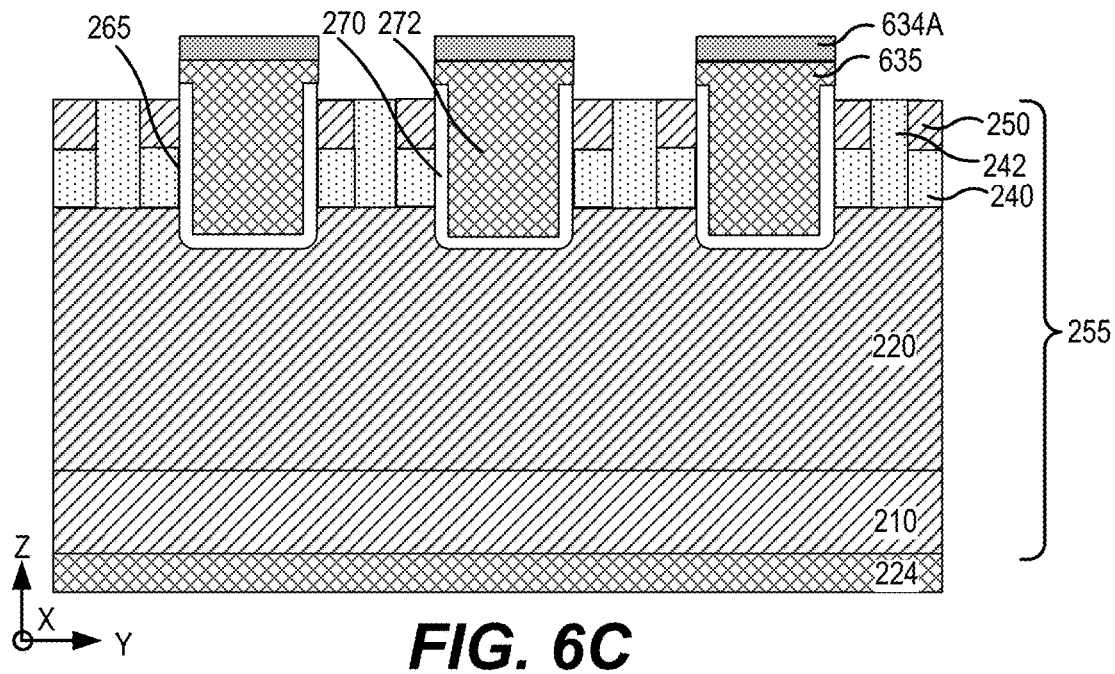
FIG. 6C is a schematic cross-sectional view taken along line 6C-6C of FIG. 6B.
Figure 6D:
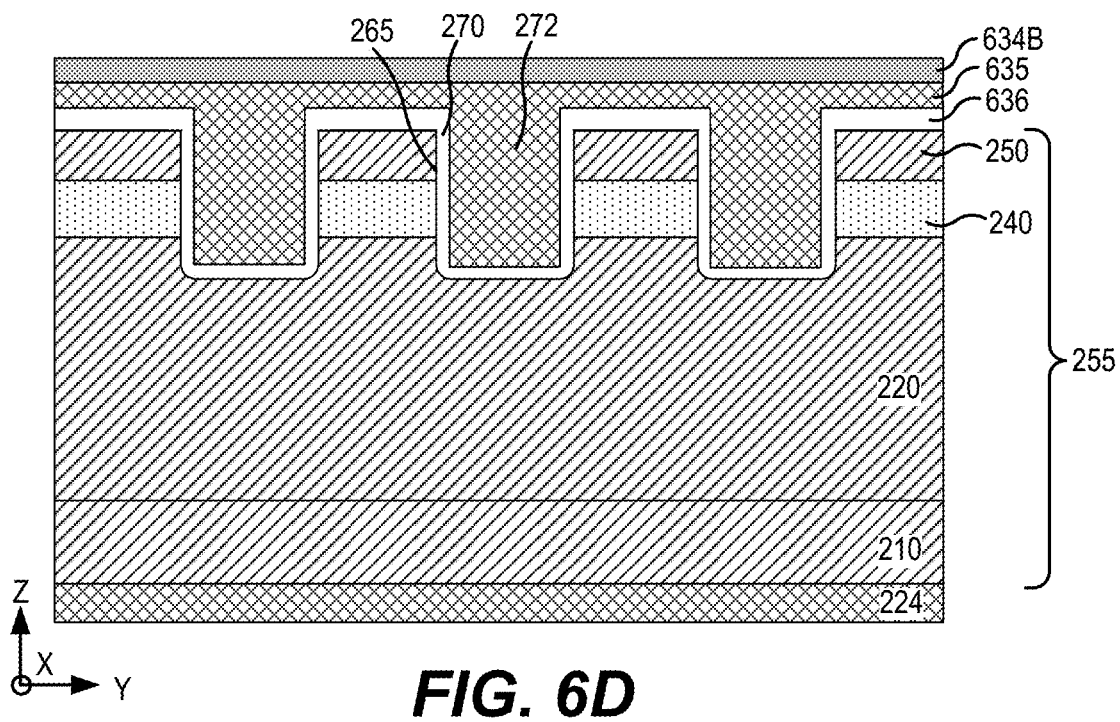
FIG. 6D is a schematic cross-sectional view taken along line 6D-6D of FIG. 6B.

To better describe the structure of the gate connectors 634, a subset of the power switching device 600 indicated by box 'B' will be described. FIG. 6B is a schematic enlarged perspective view of section 'B' of FIG. 6A. FIG. 6C is a schematic cross-sectional view taken along line 6C-6C of FIG. 6B. FIG. 6D is a schematic cross-sectional view taken along line 6D-6D of FIG. 6B.

Referring to FIG. 6B to 6D, the power switching device 600 may differ from that of, for example, FIGS. 2A-2D in that the gate connectors 634 may extend both along the gate finger 134 as well as between adjacent gate fingers 134. For example, the gate finger 134 may include gate electrode 272 and gate insulator 270. The gate connectors 634 may comprise a metal and/or metal nitride such as, for example, titanium (Ti), titanium nitride (TiN), tantalum (Ta), tantalum nitride (TaN), and/or tungsten (W), though the present disclosure is not limited thereto. The gate connector 634 may be formed as a single layer or multiple layers. The thickness of the gate connector 634 may be between 10 nm to 500 nm. The gate connectors 634 may include first portions 634A extending in a first direction (e.g., the X direction) and second portions 634B extending in a second direction (e.g., the Y direction). The first and second portions 634A, 634B of the gate connectors 634 may be electrically connected to one another.

The first portion 634A of the gate connector 634 may extend above, and parallel with, the gate finger 134. In some embodiments, the first portion 634A of the gate connector 634 may directly contact the gate electrode 272. The gate electrode 272 may comprise, for example, a silicide, doped polycrystalline silicon (poly-Si or poly), and/or a stable conductor.

In some embodiments, portions of a connector insulating layer 636 may be between the first portion 634A of the gate connector 634 and the top surface of the semiconductor layer structure 255. The connector insulating layer 636 may comprise, for example, a silicon dioxide ($SiO_2$) layer, although other insulating materials, such as $SiO_xN_y$, $Si_xN_y$, $Al_2O_3$ and/or high-K dielectrics such as hafnium oxide, and the like may be used. In some embodiments, the connector insulating layer 636 may be physically connected to and/or integral with the gate insulator 270. Thus, the gate insulator 270 and the connector insulating layer 636 may form a continuous layer.

The second portion 634B of the gate connector 634 may extend above and perpendicular to the gate finger 134. The second portion 634B of the gate connector 634 may extend on, and in some embodiments directly contact, adjacent ones of the gate electrodes 272 and may be electrically coupled to, and integral with, the first portion 634A of the gate connector 634. The second portion 634B of the gate connector 634 may be oriented similarly to the gate connector 234 illustrated with respect to FIGS. 2A-2D. Thus, the second portion 634B of the gate connector 634 may be separated from the semiconductor layer structure 255 by the connector insulating layer 636, with a connector electrode layer 635 therebetween. The connector electrode layer 635 may comprise, for example, a silicide, doped polycrystalline silicon (poly-Si or poly), and/or a stable conductor. In some embodiments, the connector electrode layer 635 may be physically connected to and/or integral with the gate electrode 272. For example, in some embodiments, the connector electrode layer 635 may form the upper surface of the gate electrode 272. In some embodiments, the connector electrode layer 635 may be composed of a same material as the gate electrode 272.

The first portions 634A and the second portions 634B of the gate connector 634 may intersect one another. For example, the first portions 634A and the second portions 634B of the gate connector 634 may intersect above various ones of the gate fingers 134. At the point of intersection of the first portions 634A and the second portions 634B of the gate connector 634, the first portions 634A and the second portions 634B of the gate connector 634 may directly contact and/or electrically connect to the gate electrode 272.

The addition of the first portions 634A of the gate connector 634 may allow for additional conductivity enhancement to the gate finger 134. By overlaying the gate electrode 272 with the first portions 634A of the gate connector 634, and connecting adjacent ones of the gate fingers 134 with the second portions 634B of the gate connector 634, the overall resistance of the gate finger 134 may be reduced due to the increased conductivity of the gate connector 634.

The steps to manufacture the power switching device 600 of FIGS. 6A to 6D may begin similarly to those illustrated and described with respect to FIGS. 3A to 3F. However, after depositing the gate connector layer 334, the electrode layer 335, and the gate insulating layer 336 (see, e.g., FIGS. 3E and 3F), the gate connector layer 334, the electrode layer 335, and the gate insulating layer 336 may be patterned/etched to form the gate connectors 634 including first and second portions 634A, 634B. As a result of the patterning/etching, portions of the electrode layer 335 and the gate insulating layer 336 disposed between the first and second portions 634A, 634B may remain as the connector electrode layer 635 and the connector insulating layer 636.

Figure 6E:
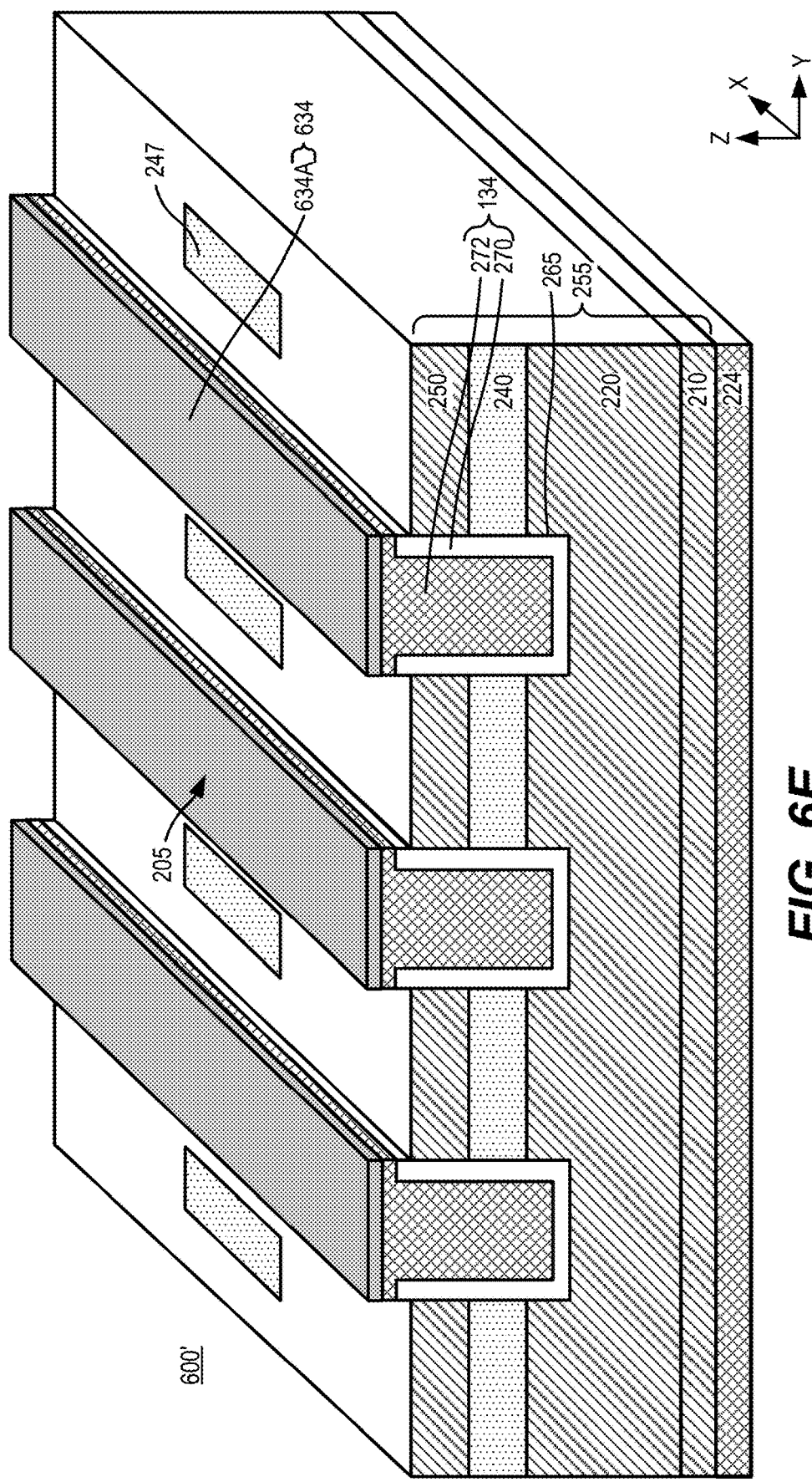
FIG. 6E is a schematic perspective view of an additional configuration of a power switching device according to some embodiments of the present disclosure.

Though FIGS. 6A to 6D illustrate embodiments of a power switching device 600 in which the gate connector 634 includes both first portions 634A and second portions 634B, it will be understood that the embodiments described herein are not limited thereto. FIG. 6E is a schematic perspective view of an additional configuration of a power switching device 600' according to some embodiments of the present disclosure. In the power switching device 600', only the first portions 634A of the gate connector 634 are present. That is to say that the second portions 634B extending between adjacent gate fingers 134 are omitted.

As with the power switching device 600, the first portion 634A of the gate connector 634 may extend above, and parallel with, the gate finger 134. In some embodiments, the first portion 634A of the gate connector 634 may directly contact the gate electrode 272.

While not having the second portions 634B to interconnect adjacent ones of the gate fingers 134, the power switching device 600' may still be improved over conventional devices because the gate connector 634 may improve a conductivity of the gate finger 134, thus improving the gate resistance of the device.

The steps to manufacture the power switching device 600' of FIG. 6E may be similar to that of power switching device 600. However, after depositing the gate connector layer 334, the electrode layer 335, and the gate insulating layer 336 (see, e.g., FIGS. 3E and 3F), the gate connector layer 334, the electrode layer 335, and the gate insulating layer 336 may be patterned/etched to form the gate connectors 634 including only the first portions 634A. As a result of the patterning/etching, portions of the electrode layer 335 and the gate insulating layer 336 disposed between the first portion 634A and the semiconductor layer structure 255 may be integrated with the gate electrode 272 and gate insulator 270.

Figure 7A:
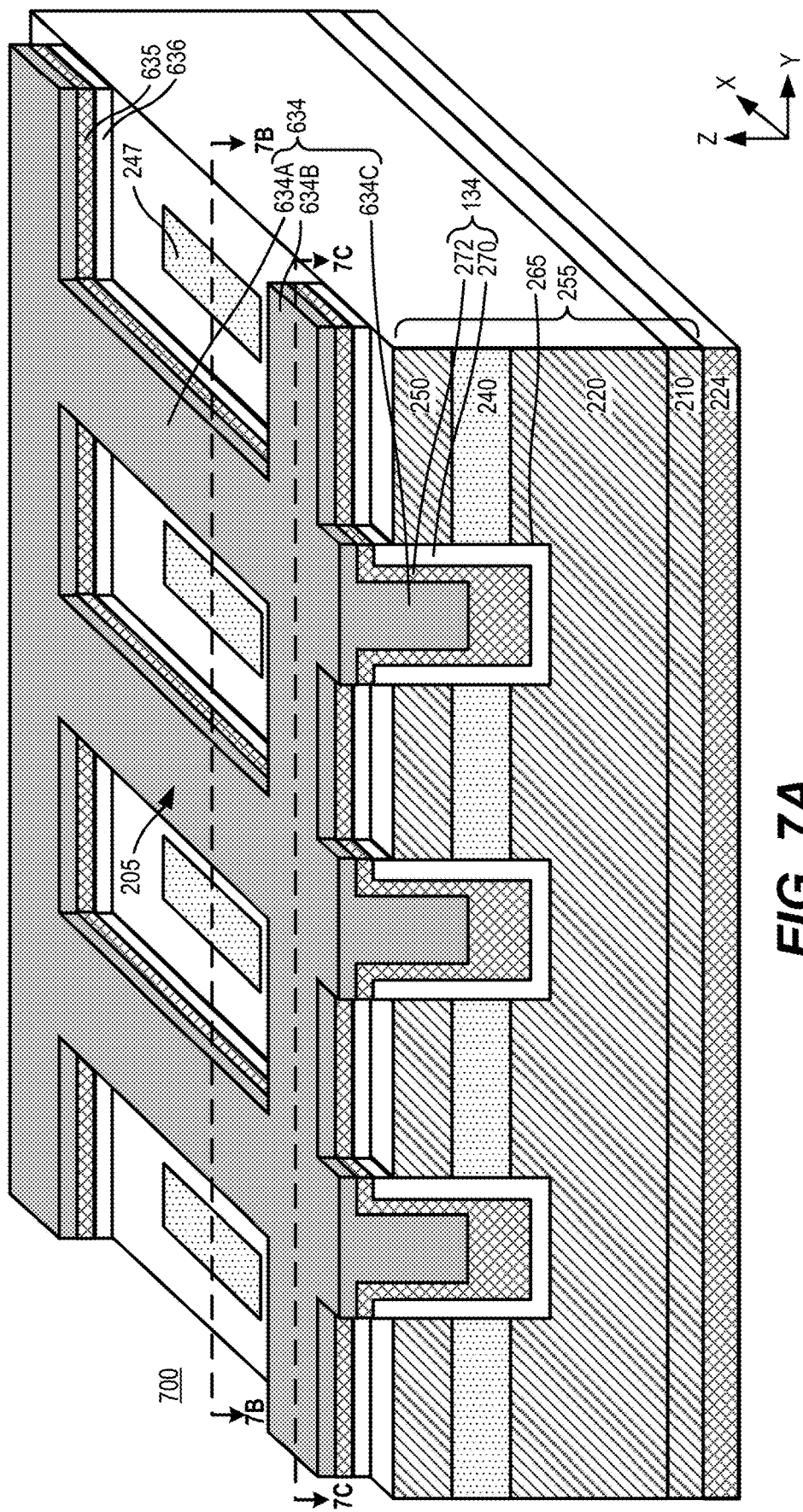
FIG. 7A is a schematic perspective view of a portion of a power switching device according to some embodiments of the present disclosure.
Figure 7B:
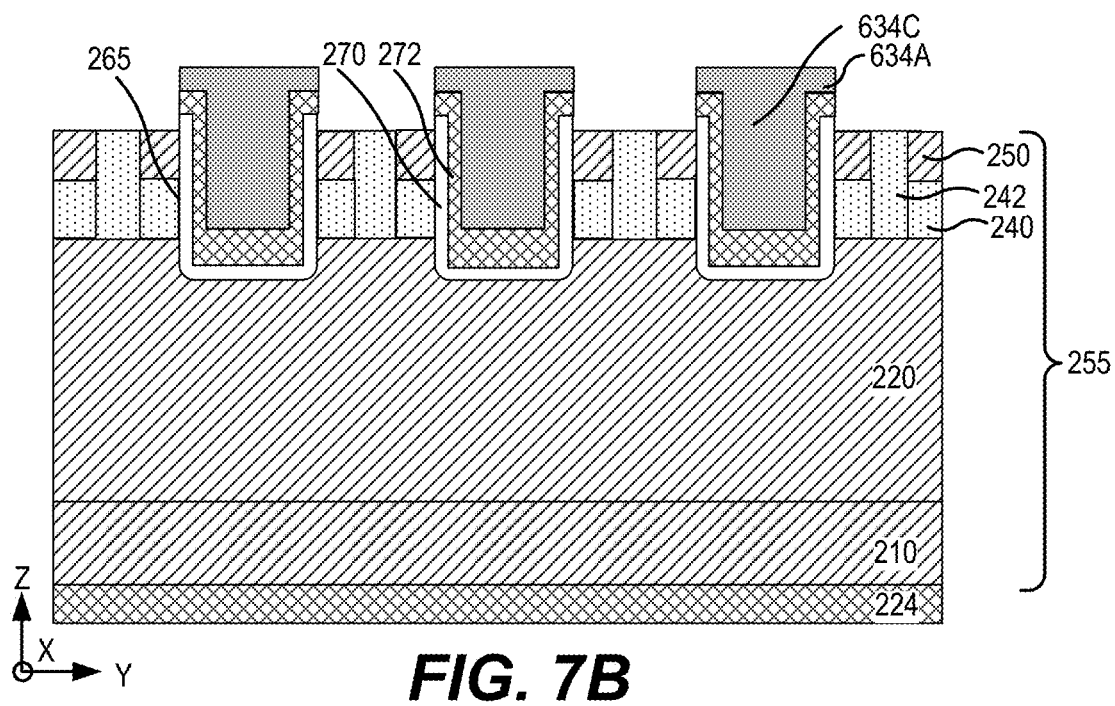
FIG. 7B is a schematic cross-sectional view taken along line 7B-7B of FIG. 7A.
Figure 7C:
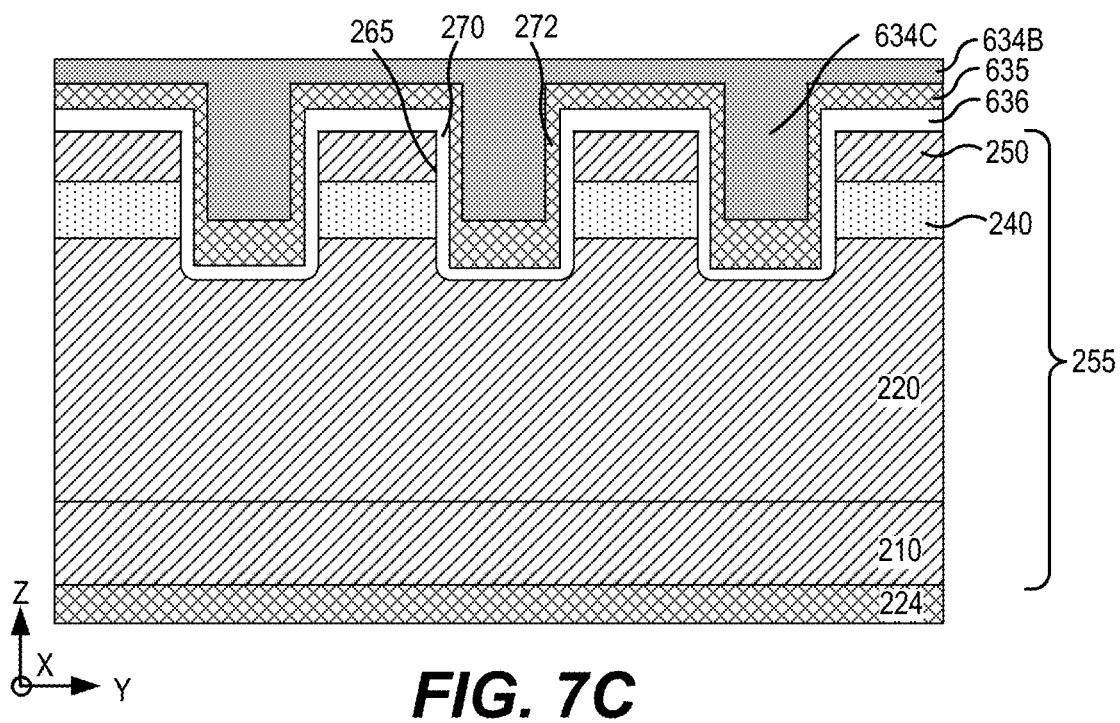
FIG. 7C is a schematic cross-sectional view taken along line 7C-7C of FIG. 7A.

FIG. 7A is a schematic perspective view of a portion of a power switching device 700 according to some embodiments of the present disclosure. FIG. 7B is a schematic cross-sectional view taken along line 7B-7B of FIG. 7A. FIG. 7C is a schematic cross-sectional view taken along line 7C-7C of FIG. 7A. A description of those elements of FIGS. 7A to 7C that are the same or similar to those described in previous figures will be omitted for brevity. Accordingly, the description of FIGS. 7A to 7C will focus on differences with the devices previously described.

Referring to FIGS. 7A to 7C, the power switching device 700 may differ from the power switching device 600 illustrated with respect to FIGS. 6A to 6D in that an additional third portion 634C of the gate connector 634 contacts and/or is within the gate electrode 272. The third portion 634C of the gate connector 634 may be formed within the gate electrode 272 below a top surface of the semiconductor layer structure 255 and a top surface of the gate electrode 272. Portions of the gate electrode 272 may be on sidewalls of the third portion 634C of the gate connector 634. In some embodiments, a bottom surface of the third portion 634C of the gate connector 634 may extend below a bottom surface of the source/drain regions 250. The first portion 634A, the second portion 634B, and the third portion 634C of the gate connector 634 may all be integrally connected. Thus, the gate connector 634 may extend on surfaces of the gate electrode 272 of the gate fingers 134, below an upper surface of the gate electrode 172, and between adjacent gate fingers 134. By using a gate connector 634 comprising a material (e.g., a metal) with a higher conductivity than a material of the gate electrode 272 (e.g., polysilicon), a gate resistance of the power switching device 700 may be reduced and the performance of the device may be improved.

Figure 7D:
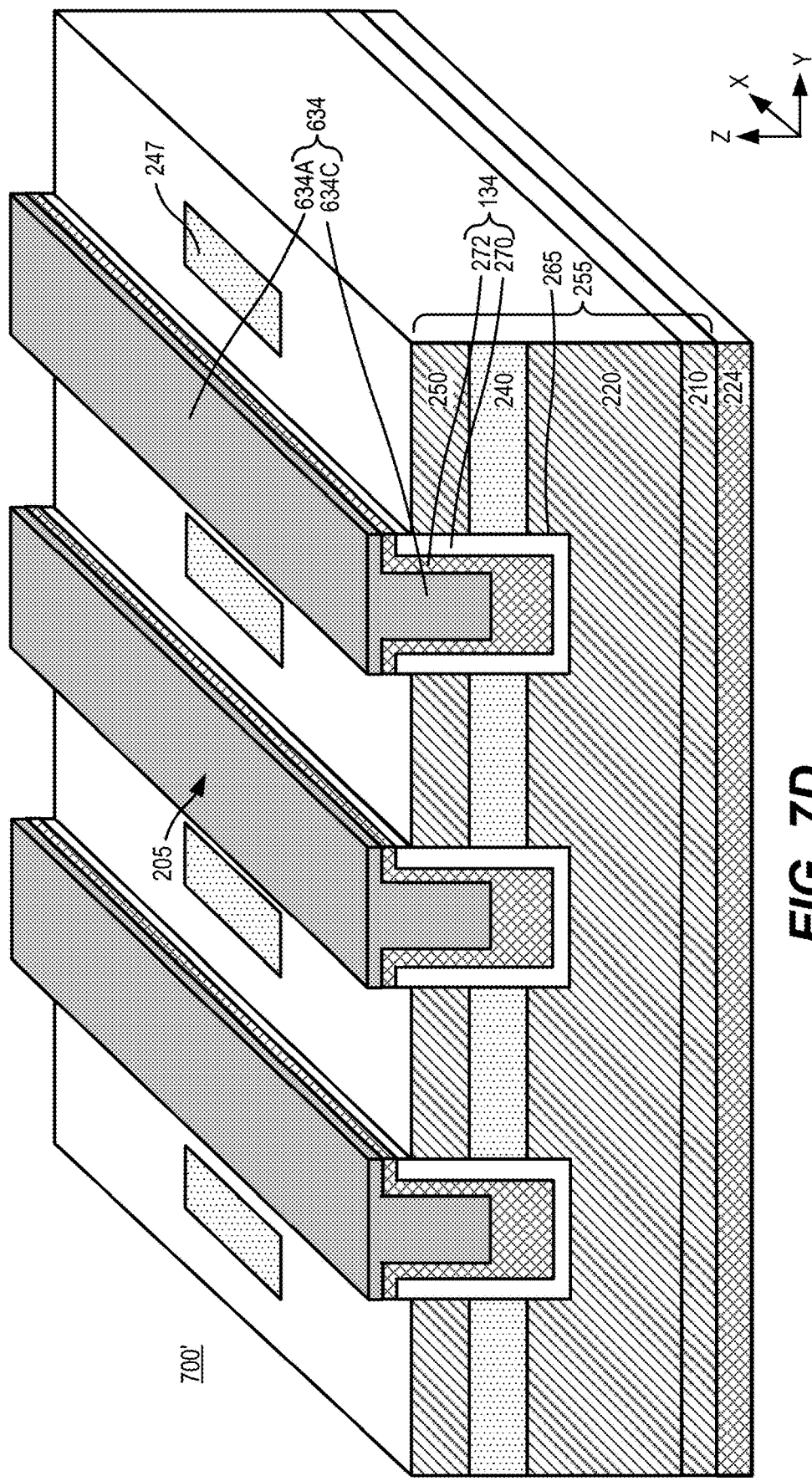
FIG. 7D is a schematic perspective view of an additional configuration of a power switching device according to some embodiments of the present disclosure.

FIG. 7D is a schematic perspective view of an additional configuration of a power switching device 700' according to some embodiments of the present disclosure. The power switching device 700' is similar to that of the power switching device 600' with the addition of the third portion 634C of the gate connector 634. In other words, the power switching device 700' may omit the second portion 634B of the gate connector 634 that connects adjacent ones of the gate fingers 134. As with the power switching device 700, the first portion 634A of the gate connector 634 may extend above, and parallel with, the gate finger 134. The first portion 634A of the gate connector 634 may be integrally connected with the third portion 634C of the gate connector 634. The third portion 634C of the gate connector 634 may extend below an upper surface of the gate electrode 172. In some embodiments, the first portion 634A of the gate connector 634 may directly contact the gate electrode 272.

Figure 8A:
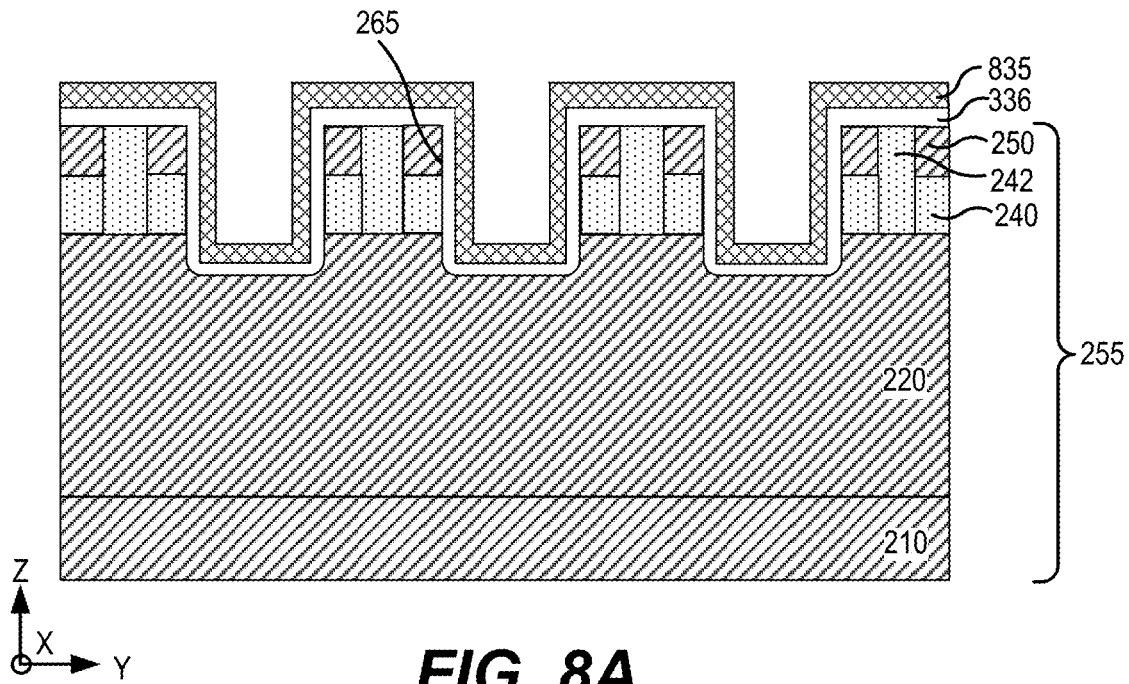
FIGS. 8A to 8D are schematic cross-sectional views illustrating methods of manufacturing the power switching device of FIGS. 7A to 7C according to some embodiments of the present disclosure.
Figure 8B:
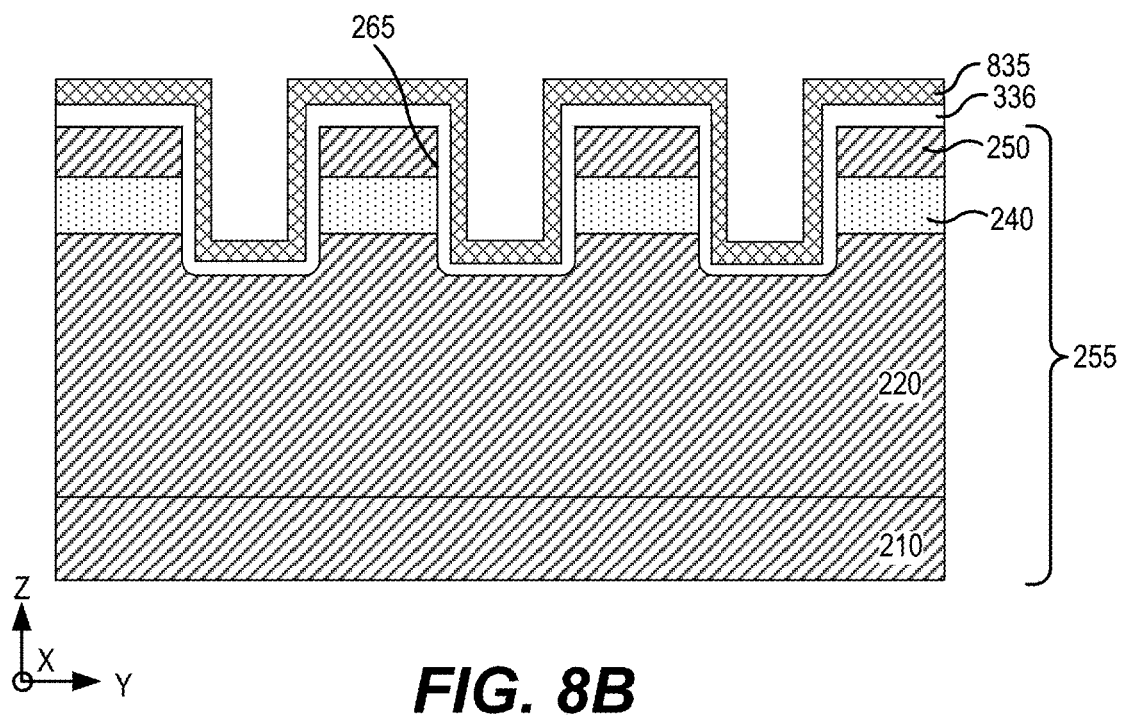
Figure 8C:
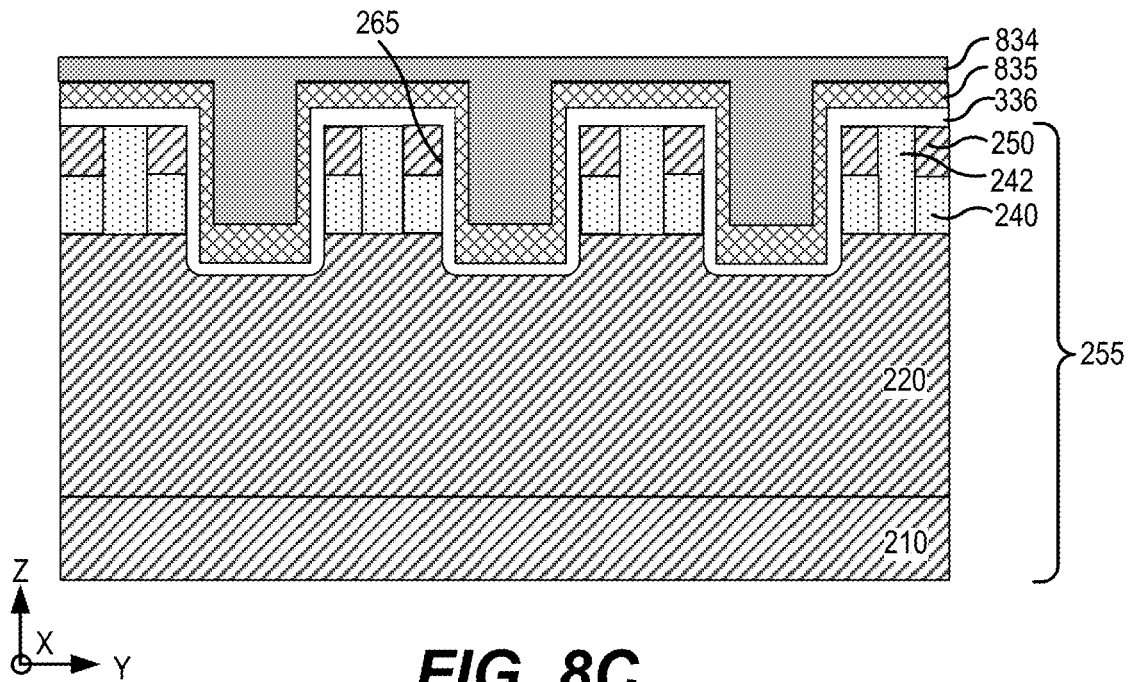
Figure 8D:
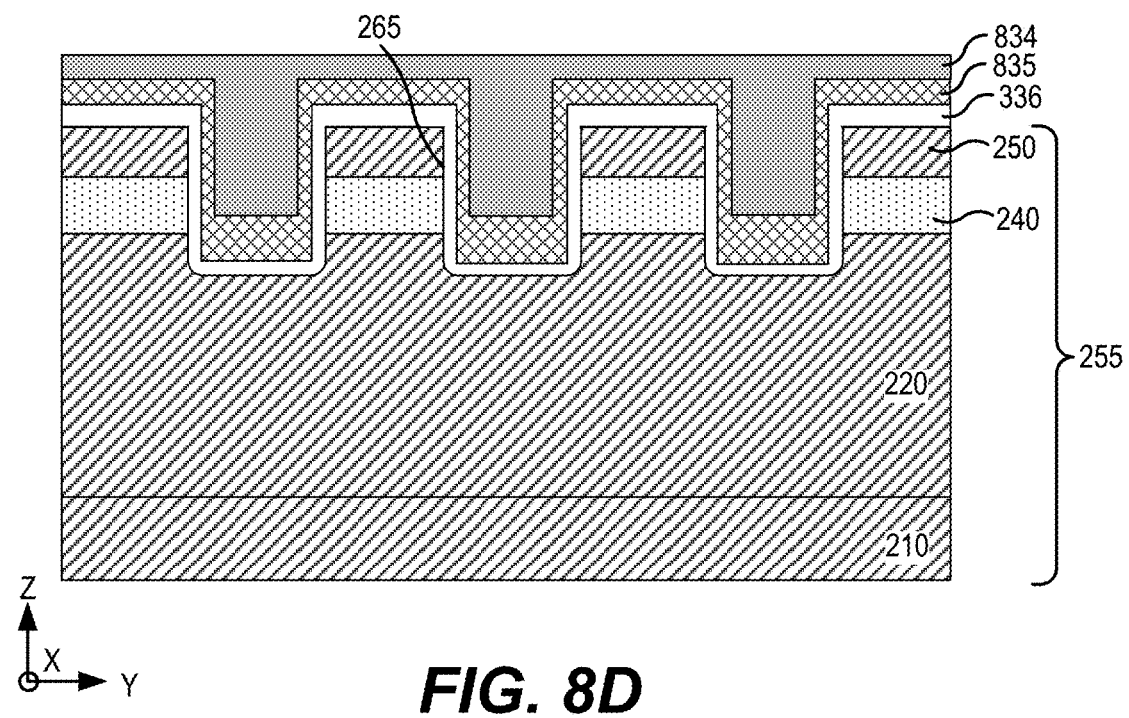

FIGS. 8A to 8D are schematic cross-sectional views illustrating methods of manufacturing the power switching device 700 of FIGS. 7A to 7C according to some embodiments of the present disclosure. FIGS. 8A and 8C are cross-sections taken along the line 7B-7B of FIG. 7A (e.g., along the exposed portions 247 of the p-well 242). FIGS. 8B and 8D are cross-sections taken along the line 7C-7C of FIG. 7A (e.g., along the gate connector 634). A description of those elements of FIGS. 8A to 8D that are the same or similar to those of previously-described figures will be omitted for brevity. Accordingly, the description of FIGS. 8A to 8D will focus on differences with the devices and/or method previously described.

Initial steps to form the power switching device 700 of FIGS. 7A to 7C may be similar to those illustrated and described with respect to FIGS. 3A and 3B, and a duplicate description thereof will be omitted.

Referring to FIGS. 8A and 8B, a gate insulating layer 336 may be formed on the upper surface of the semiconductor layer structure 255 and in the trenches 265. In some embodiments, the gate insulating layer 336 may be formed (e.g., deposited and/or grown) on the sidewalls and bottom of the trench. The gate insulating layer 336 may comprise, for example, a silicon ($SiO_2$) layer, although other insulating materials, such as $SiO_xN_y$, $Si_xN_y$, $Al_2O_3$ and/or high-K dielectrics such as hafnium oxide, and the like may be used.

An electrode layer 835 may be formed on the gate insulating layer 336. The electrode layer 835 may also be formed within the trench 265 such that the electrode layer 835 may be formed on the sidewalls and the bottom surface of the trench 265. The electrode layer 835 may differ from the electrode layer 335 of FIGS. 3C and 3D in that the electrode layer 835 may not completely fill the trench 265. Thus, a void may be present between the sidewalls of the trench 265 in which no electrode layer 835 is present. For example, the electrode layer 835 may be formed by a conformal, or nearly conformal, deposition of the electrode layer material. The electrode layer 835 may include, for example, a silicide, doped polycrystalline silicon (poly-Si or poly), and/or a stable conductor.

Referring to FIGS. 8C and 8D, a gate connector layer 834 may be formed on the upper surface of the electrode layer 835 and the gate insulating layer 336. In some embodiments, the gate connector layer 834 may be deposited as a blanket layer. The gate connector layer 834 may comprise a metal and/or metal nitride such as, for example, Ti, TiN, Ta, TaN, and/or W, though the present disclosure is not limited thereto. The gate connector layer 834 may be formed as a single layer or multiple layers. The gate connector layer 834 may be formed in a single step or multiple steps. The thickness of portions of the gate connector layer 834 that are on the semiconductor layer structure 255 may be between 10 nm to 500 nm. The gate connector layer 834 may also be formed within the trench 265. For example, the gate connector layer 834 may be within and/or fill remaining spaces in the trench 265 between the sidewalls of the trench 265. Portions of the gate connector layer 834 may extend below an upper surface of the semiconductor layer structure 255.

Referring back to FIGS. 7A to 7C, the gate connector layer 834, the electrode layer 835, and the gate insulating layer 336 may be patterned and etched to form the gate connectors 634, the connector electrode layer 635, the connector insulating layer 636, the gate insulator 270, and the gate electrode 272. For example, the gate connector layer 834, the electrode layer 835, and the gate insulating layer 336 may be patterned so as to leave a plurality of portions of the gate connector layer 834, the electrode layer 835, and the gate insulating layer 336 extending both perpendicular to and parallel with the trenches 265. The remaining portions of the gate connector layer 834, the electrode layer 835, and the gate insulating layer 336 may form the first, second, and third portions 634A, 634B, 634C of the gate connectors 634, the connector electrode layer 635, and the connector insulating layer 636. The connector electrode layer 635 may be physically connected to and/or integral with the gate electrode 272. The connector insulating layer 636 may be physically connected to and/or integral with the gate insulator 270. The first, second, and third portions 634A, 634B, 634C of the gate connector 634 may be physically connected to and/or integral with one another such that the gate connector 634 extends below a top surface of the semiconductor layer structure 255 and contacts the gate electrode 272.

Referring back to FIG. 7D, the manufacturing steps of the power switching device 700' may differ from that of the power switching device 700 in that the gate connector layer 834, the electrode layer 835, and the gate insulating layer 336 may be patterned so as to leave a plurality of portions of the gate connector layer 834, the electrode layer 835, and the gate insulating layer 336 extending parallel with the trenches 265. The remaining portions of the gate connector layer 834, the electrode layer 835, and the gate insulating layer 336 may form the first and third portions 634A, 634C of the gate connectors 634, the connector electrode layer 635, and the connector insulating layer 636.

Though the examples of FIGS. 6A to 8D have focused on examples of gate connectors 634 having first and second portions 634A, 634B with a connector electrode layer 635 between the second portions 634B and the connector insulating layer 636, it will be understood that the present embodiments are not limited thereto. For example, those of ordinary skill in the art will recognize that the modifications to the power device 200' illustrated and described with respect to FIGS. 4A to 5D that remove the connector electrode layer 235 from between of the gate connector 234 and the connector insulating layer 236 may be equally applied, mutatis mutandis, to the embodiments described with respect to FIGS. 6A to 8D.

Figure 9A:
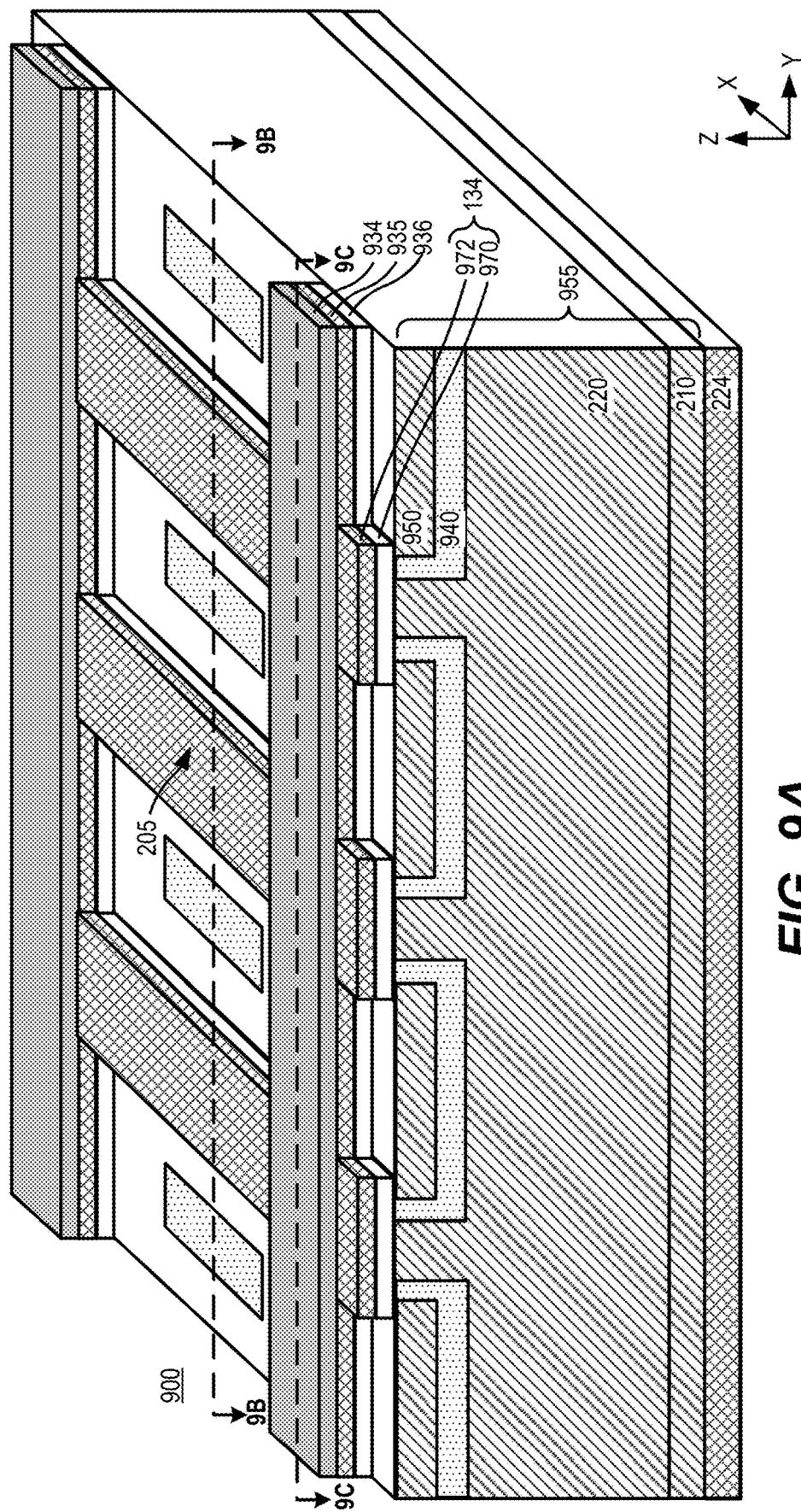
FIG. 9A is a schematic perspective view of a portion of a power switching device according to some embodiments of the present disclosure.
Figure 9B:
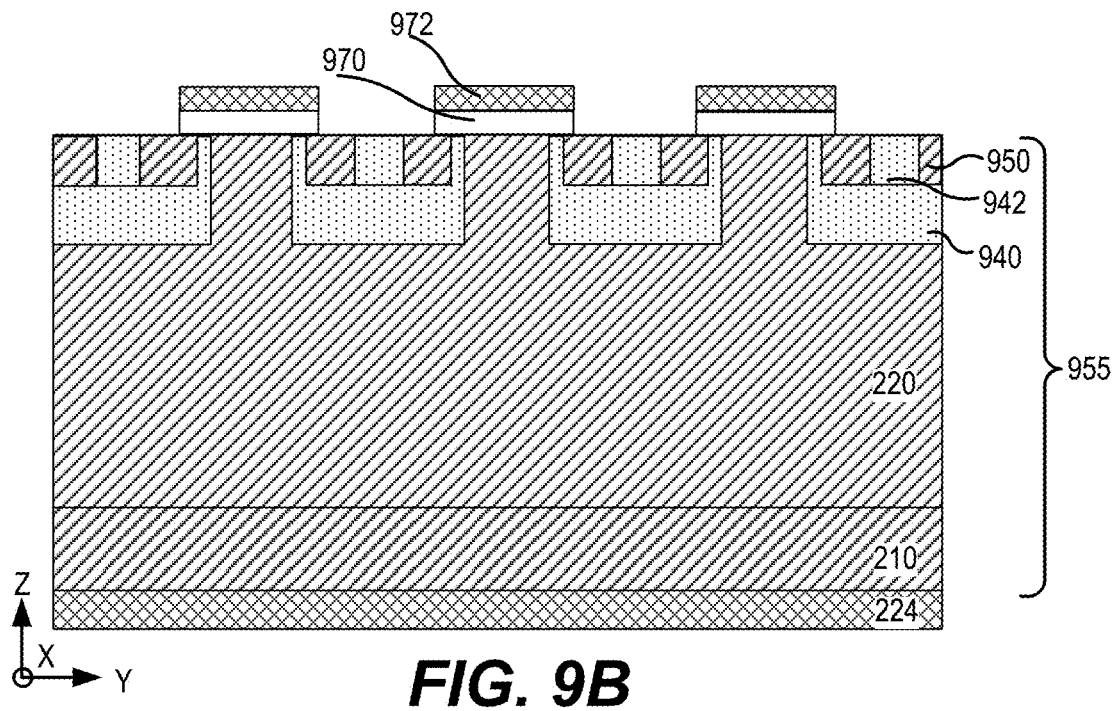
FIG. 9B is a schematic cross-sectional view taken along line 9B-9B of FIG. 9A.
Figure 9C:
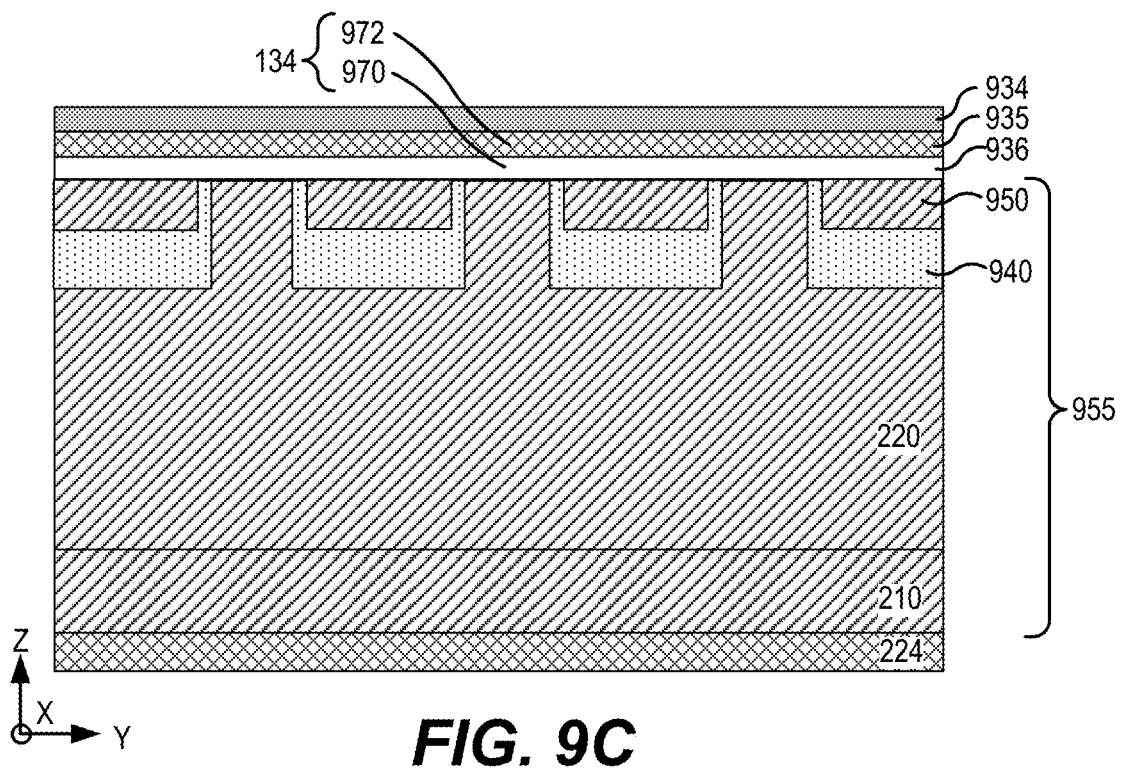
FIG. 9C is a schematic cross-sectional view taken along line 9C-9C of FIG. 9A.

Though the prior examples have focused primarily on the use of gate connectors for trench-style devices, the embodiments described herein are not limited thereto. FIG. 9A is a schematic perspective view of a portion of a power switching device 900 according to some embodiments of the present disclosure. FIG. 9B is a schematic cross-sectional view taken along line 9B-9B of FIG. 9A. FIG. 9C is a schematic cross-sectional view taken along line 9C-9C of FIG. 9A. A description of those elements of FIGS. 9A to 9C that are the same or similar to those described in previous figures will be omitted for brevity. Accordingly, the description of FIGS. 9A to 9C will focus on differences with the devices previously described.

The power switching device 900 differs from the previous power switching devices primarily due to its planar gate structure. For example, gate fingers 134 may be formed as portions of a gate electrode 972 formed on a gate insulator 970. The gate fingers 134 may be arranged in the active area of the device and extending in parallel in a manner similar to that illustrated in FIG. 2A.

The gate fingers 134 may be formed on a semiconductor layer structure 955. As previously described, the semiconductor layer structure 955 may include an n-type wide band-gap semiconductor substrate 210 and a lightly-doped n-type (n) silicon carbide drift region 220. An upper portion of the n-type silicon carbide drift region 220 may comprise an n-type silicon carbide current spreading layer in some embodiments that is more heavily doped than the lower portion of the n-type silicon carbide drift region 220.

An upper portion of the n-type silicon carbide drift region 220 may be doped p-type by ion implantation to form p-wells 940. An upper portion 942 of each p-well 940 may be more heavily doped with p-type dopants. Heavily-doped ($n^+$) n-type silicon carbide source regions 950 may be formed in upper portions of the p-wells 940 directly adjacent and contacting the more heavily doped portions 942 of the p-wells 940. A drain contact 224 may be formed on the lower surface of the substrate 210. Current may flow from the n-type source regions 950 through the drift region 220 that is underneath the gate electrode 972 when a voltage is applied to the gate electrode 972.

The gate electrode 972 may be formed on the gate insulator 970 to form the gate finger 134. The gate electrode 972 may include, for example, a silicide, doped polycrystalline silicon (poly-Si or poly), and/or a stable conductor. As illustrated in FIG. 9A, the gate connectors 934 may be disposed on a surface of the power switching device 900 to be on and/or contact one or more of the gate fingers 134. The gate connectors 934 may extend perpendicularly to the gate finger 134 and may be separated from one another in a direction that is parallel to the gate finger 134. For example, as illustrated in FIGS. 9A to 9C, the gate fingers 134 may extend in an X direction and the plurality of gate connectors 934 may extend in the Y direction. The plurality of gate connectors 934 may be arranged in the X direction to periodically be on and/or contact the gate fingers 134. The gate connector 934 may extend on adjacent ones of the gate electrodes 972 and a given gate electrode 972 may be connected to and/or directly contacting more than one gate connector 934. The gate connector 934 may comprise a metal and/or metal nitride such as, for example, titanium (Ti), titanium nitride (TiN), tantalum (Ta), tantalum nitride (TaN), and/or tungsten (W), though the present disclosure is not limited thereto. The gate connector 934 may be formed as a single layer or multiple layers. The thickness of the gate connector 934 may be between 10 nm to 500 nm.

In some embodiments, one or more layers may separate the gate connector 934 from a top surface of the semiconductor layer structure 955. For example, in some embodiments a connector insulating layer 936 may be disposed between the gate connector 934 and the top surface of the semiconductor layer structure 955. The connector insulating layer 936 may comprise, for example, a silicon dioxide ($SiO_2$) layer, although other insulating materials, such as $SiO_xN_y$, $Si_xN_y$, $Al_2O_3$ and/or high-K dielectrics such as hafnium oxide, and the like may be used. In some embodiments, the connector insulating layer 936 may be physically connected to and/or integral with the gate insulator 970. Thus, the gate insulator 970 and the connector insulating layer 936 may form a continuous layer, with portions of the gate insulator 970 and portions of the connector insulating layer 936 extending on the surface of the semiconductor layer structure 955.

In some embodiments, a connector electrode layer 935 may be disposed between the gate connector 934 and the connector insulating layer 936. The connector electrode layer 935 may comprise, for example, a silicide, doped polycrystalline silicon (poly-Si or poly), and/or a stable conductor. In some embodiments, the connector electrode layer 935 may be physically connected to and/or integral with the gate electrode 972. In some embodiments, the connector electrode layer 935 may include a portion of the gate electrode 972 that extends above a top surface of the semiconductor layer structure 255 between adjacent ones of the gate fingers 134.

As with the previously-described devices, the use of the gate connector 934 may allow the higher conductivity of the material of the gate connector 934 to reduce the overall gate resistance of the power switching device 900. It will be understood that the variations of the power switching devices previously described herein may be similarly applied to the power switching device 900. For example, gate connectors having first and second intersecting portions such as those in FIGS. 6A to 6D may also be utilized with respect to planar switching devices.

Figure 10A:
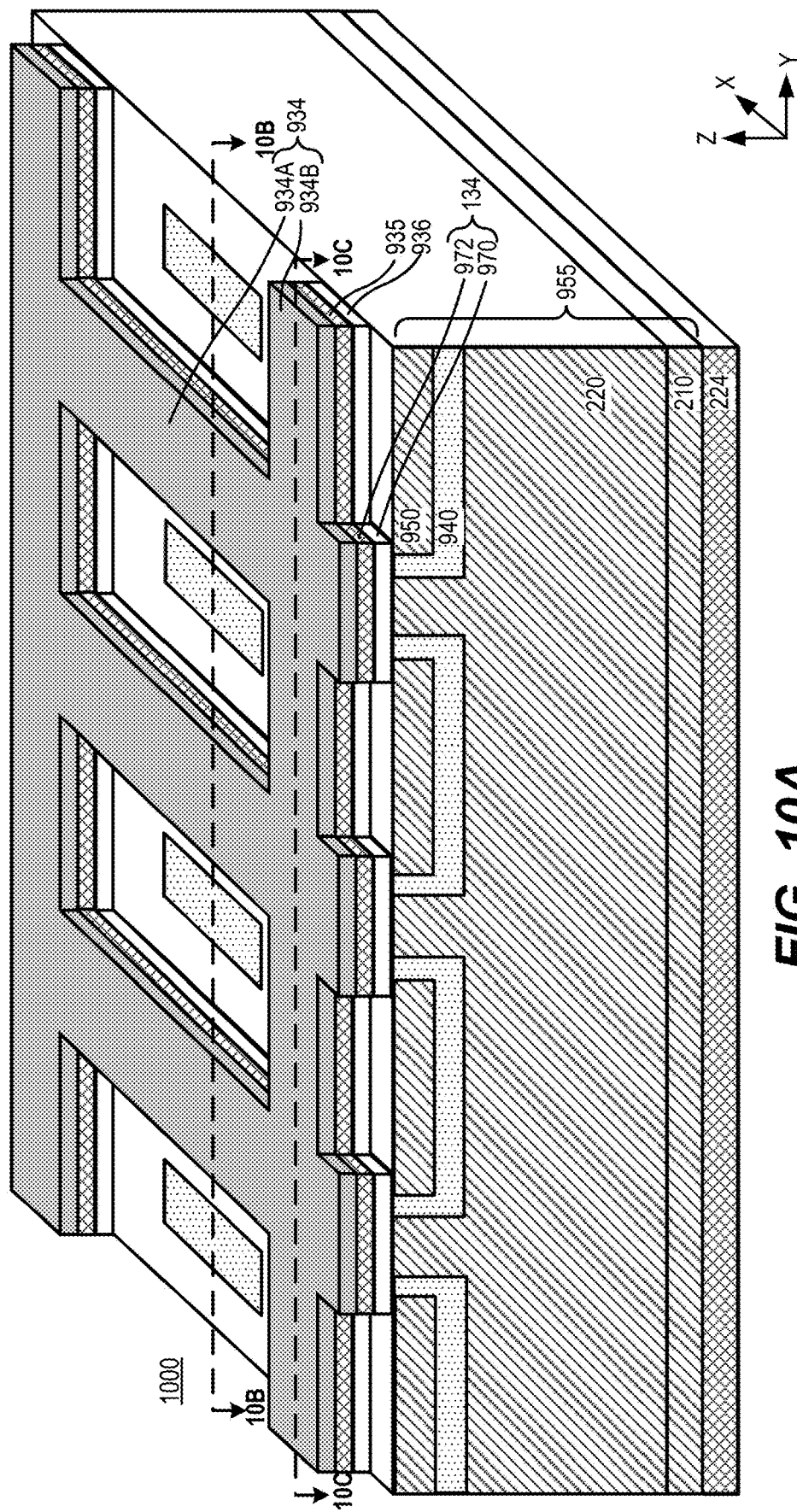
FIG. 10A is a schematic perspective view of a portion of a power switching device according to some embodiments of the present disclosure.
Figure 10B:
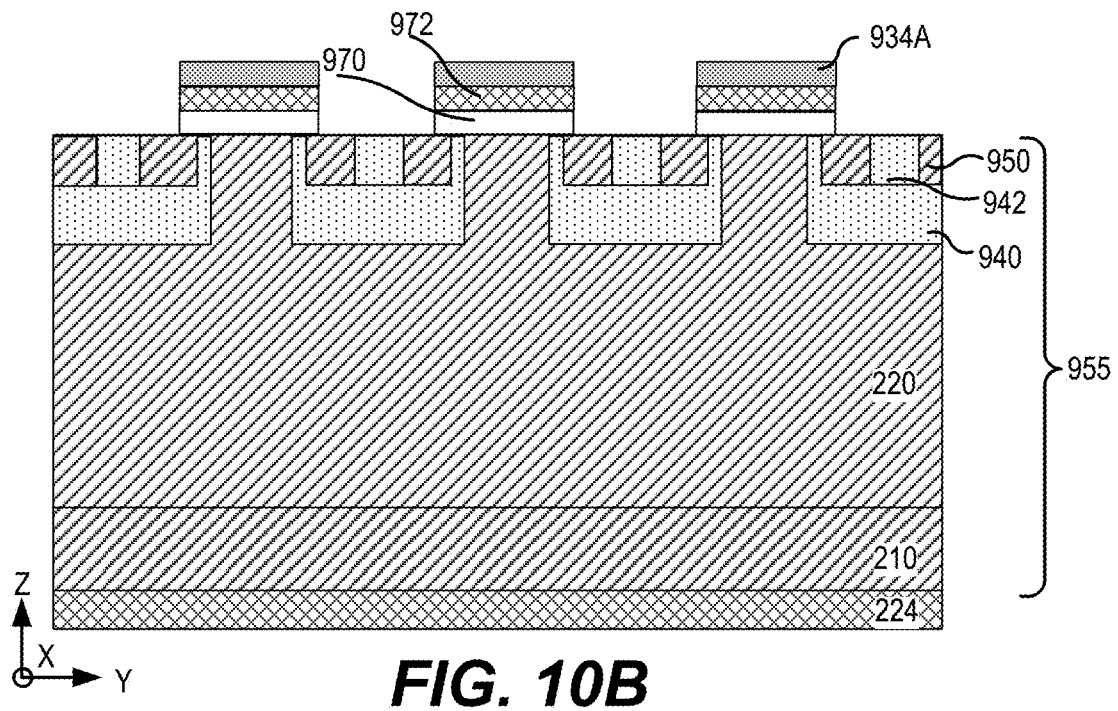
FIG. 10B is a schematic cross-sectional view taken along line 10B-10B of FIG. 10A.
Figure 10C:
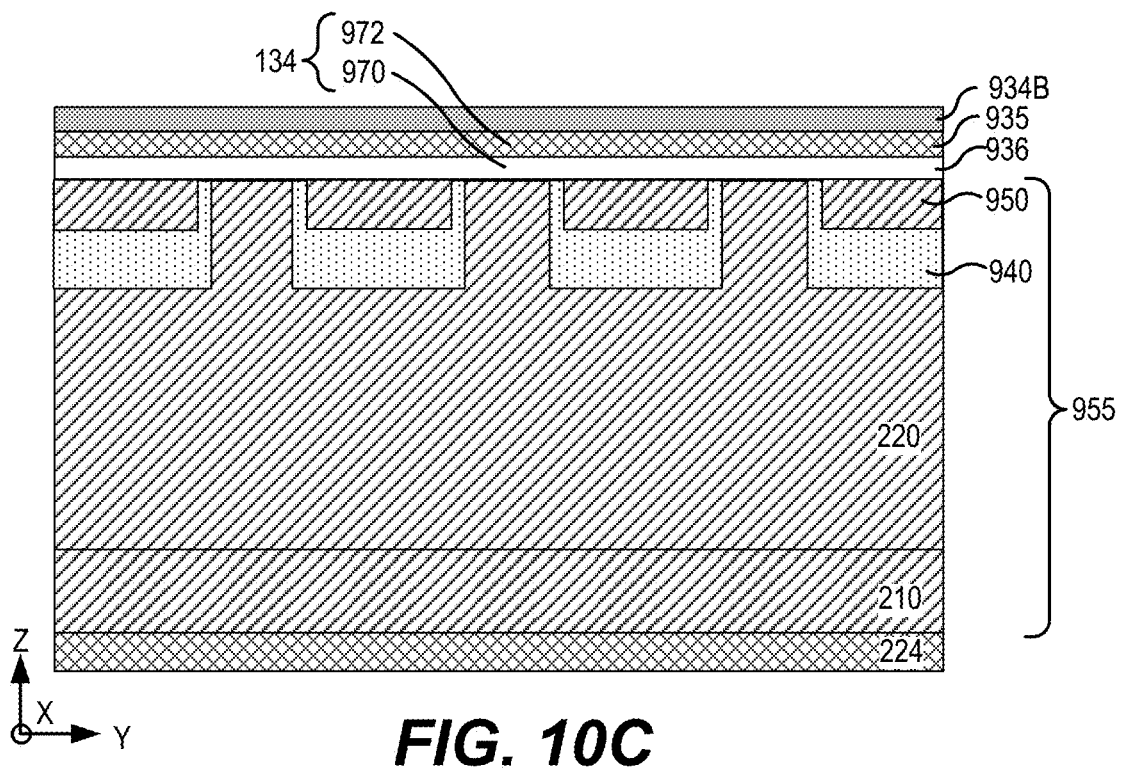
FIG. 10C is a schematic cross-sectional view taken along line 10C-10C of FIG. 10A.

FIG. 10A is a schematic perspective view of a portion of a power switching device 1000 according to some embodiments of the present disclosure. FIG. 10B is a schematic cross-sectional view taken along line 10B-10B of FIG. 10A. FIG. 10C is a schematic cross-sectional view taken along line 10C-10C of FIG. 10A. A description of those elements of FIGS. 10A to 10C that are the same or similar to those described in previous figures will be omitted for brevity. Accordingly, the description of FIGS. 10A to 10C will focus on differences with the devices previously described.

Referring to FIGS. 10A to 10C, the gate connectors 934 may be disposed on a surface of the power switching device 1000 to contact one or more of the gate fingers 134 as in FIGS. 9A-9C. In addition, gate connectors 934 may also extend on, and in some embodiments cover, a surface of the gate fingers 134. Thus, the plurality of gate connectors may include a first portion 934A of gate connectors 934 extending in a first direction (e.g., an X direction in FIG. 9A) and a second portion 934B of gate connectors 934 extending a second direction that crosses the first direction (e.g., a Y direction in FIG. 9A).

The gate finger 134 may include gate electrode 972 and gate insulator 970. The gate connector 934 may comprise a metal and/or metal nitride such as, for example, titanium (Ti), titanium nitride (TiN), tantalum (Ta), tantalum nitride (TaN), and/or tungsten (W), though the present disclosure is not limited thereto. The gate connector 934 may be formed as a single layer or multiple layers. The thickness of the gate connector 634 may be between 10 nm to 500 nm.

The power switching device 1000 may differ from that of, for example, FIGS. 9A-9C in that the gate connector 934 may extend both along the gate finger 134 as well as between adjacent gate fingers 134. The gate connector 934 may include first portions 934A extending in a first direction (e.g., the X direction) and second portions 934B extending in a second direction (e.g., the Y direction). The first and second portions 934A, 934B of the gate connectors 934 may be electrically connected to one another.

The first portion 934A of the gate connector 934 may extend above, and parallel with, the gate finger 134. The first portion 934A of the gate connector 934 may be separated from the gate electrode 972 by a connector electrode layer 935. The connector electrode layer 935 may comprise, for example, a silicide, doped polycrystalline silicon (poly-Si or poly), and/or a stable conductor. In some embodiments, the connector electrode layer 935 may be physically connected to and/or integral with the gate electrode 972. In some embodiments, the connector electrode layer 935 may be a portion of the gate electrode 972 that extends between adjacent ones of the gate fingers 134.

In some embodiments, portions of a connector insulating layer 936 may be between the connector electrode layer 935 and the top surface of the semiconductor layer structure 955. The connector insulating layer 936 may comprise, for example, a silicon dioxide ($SiO_2$) layer, although other insulating materials, such as $SiO_xN_y$, $Si_xN_y$, $Al_2O_3$ and/or high-K dielectrics such as hafnium oxide, and the like may be used. In some embodiments, the connector insulating layer 936 may be physically connected to and/or integral with the gate insulator 970. Thus, the gate insulator 970 and the connector insulating layer 936 may form a continuous layer.

The second portion 934B of the gate connector 934 may extend above, and perpendicular to, the gate finger 134. The second portion 934B of the gate connector 934 may extend on adjacent ones of the gate electrodes 972 and may be electrically coupled to, and integral with, the first portion 934A of the gate connector 934. The second portion 934B of the gate connector 934 may be oriented similarly to the gate connector 934 illustrated with respect to FIGS. 9A to 9C. Thus, the second portion 934B of the gate connector 934 may be separated from the semiconductor layer structure 955 by the connector insulating layer 936, with the connector electrode layer 935 therebetween.

The first portions 934A and the second portions 934B of the gate connector 934 may intersect one another. For example, the first portions 934A and the second portions 934B of the gate connector 934 may intersect above and/or directly contact various ones of the gate fingers 134.

Figure 10D:
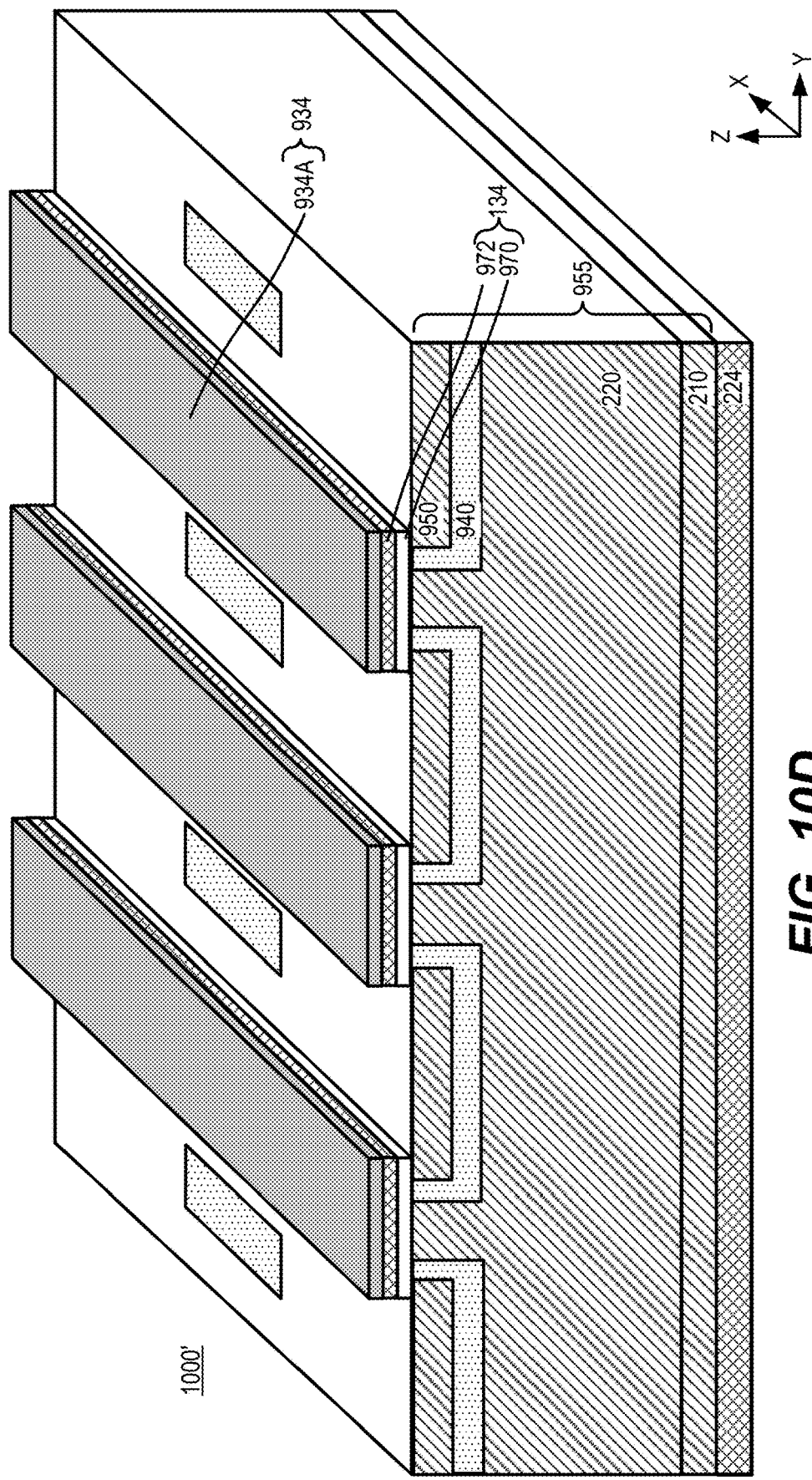
FIG. 10D is a schematic perspective view of an additional configuration of a power switching device according to some embodiments of the present disclosure.

Though FIGS. 10A to 10C illustrate embodiments of a power switching device 1000 in which the gate connector 934 includes both first portions 934A and second portions 934B, it will be understood that the embodiments described herein are not limited thereto. FIG. 10D is a schematic perspective view of an additional configuration of a power switching device 1000' according to some embodiments of the present disclosure. In the power switching device 1000', only the first portions 934A of the gate connector 934 are present. That is to say that the second portions 934B extending between adjacent gate fingers 134 are omitted.

As with the power switching device 1000, the first portion 934A of the gate connector 934 may extend above, and parallel with, the gate finger 134. In some embodiments, the first portion 934A of the gate connector 934 may directly contact the gate electrode 972.

While not having the second portions 934B to interconnect adjacent ones of the gate fingers 134, the power switching device 1000' may still be improved over conventional devices because the gate connector 934 may improve a conductivity of the gate finger 134, thus improving the gate resistance of the device.

Though not illustrated explicitly, one of ordinary skill in the art will recognize that the devices of FIGS. 9A to 10D may be manufactured similarly to those devices previously described. Namely, an insulating layer, an electrode layer, and a connector layer may be deposited on the surface of the semiconductor layer structure 255. The connector layer may be patterned/etched along with the insulating layer and the electrode layer to form the devices of FIGS. 9A to 10D.

The power switching devices according to embodiments disclosed herein may provide significantly improved performance. The use of gate connectors as described herein may increase a conductivity of the device and allow for a lowered gate resistance. The lowered gate resistance may improve, for example, a switching performance of the device.

It will be appreciated that the specific layer structure, doping concentrations, materials, conductivity types and the like that are shown in the figures and/or described herein are merely provided as examples to illustrate in detail the structure of a specific example embodiment. Thus, the specific details discussed below are not limiting to the present invention.

While some of the preceding figures illustrate the structure of a unit cell of an n-channel MOSFET, it will be appreciated that pursuant to further embodiments of the present invention, the polarity of each of the semiconductor layers in each device could be reversed so as to provide corresponding p-channel MOSFETs.

Herein, embodiments of the present invention are described with respect to cross-sectional diagrams that show one or two unit cells of a power switching devices. It will be appreciated that actual implementations will typically include a much larger number of unit cells. However, it will also be appreciated that the present invention is not limited to such devices, and that the claims appended hereto also cover MOSFETs and other power switching devices that comprise, for example, a single unit cell. Moreover, while the present disclosure focuses on silicon carbide devices, it will be appreciated that embodiments of the present invention may also have applicability to devices formed using other wide band-gap semiconductors such as, for example, gallium nitride, zinc selenide or any other II-VI or III-V wide band-gap compound semiconductors.

The invention has been described above with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on," "connected to," or "coupled to" another element or layer, it can be directly on, connected or coupled to the other element or layer, or intervening elements or layers may be present. In contrast, when an element is referred to as being "directly on," "directly connected to," or "directly coupled to" another element or layer, there are no intervening elements or layers present. As used herein, the term "and/or" includes any and all combinations of one or more of the associated listed items. Like numbers refer to like elements throughout.

It will be understood that although the terms first and second are used herein to describe various regions, layers and/or elements, these regions, layers and/or elements should not be limited by these terms. These terms are only used to distinguish one region, layer or element from another region, layer or element. Thus, a first region, layer or element discussed below could be termed a second region, layer or element, and similarly, a second region, layer or element may be termed a first region, layer or element without departing from the scope of the present invention.

Relative terms, such as "lower" or "bottom" and "upper" or "top," may be used herein to describe one element's relationship to another element as illustrated in the drawings. It will be understood that relative terms are intended to encompass different orientations of the device in addition to the orientation depicted in the drawings. For example, if the device in the drawings is turned over, elements described as being on the "lower" side of other elements would then be oriented on "upper" sides of the other elements. The exemplary term "lower" can, therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, elements, and/or components, but do not preclude the presence or addition of one or more other features, elements, components, and/or groups thereof.

Embodiments of the invention are described herein with reference to cross-sectional illustrations that are schematic illustrations. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Thus, the regions illustrated in the figures are schematic in nature and their shapes are not intended to illustrate the actual shape of a region of a device and are not intended to limit the scope of the invention.

It will be understood that the embodiments disclosed herein can be combined. Thus, features that are pictured and/or described with respect to a first embodiment may likewise be included in a second embodiment, and vice versa.

While the above embodiments are described with reference to particular figures, it is to be understood that some embodiments of the present invention may include additional and/or intervening layers, structures, or elements, and/or particular layers, structures, or elements may be deleted. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed is:

1. A semiconductor device comprising:
   a semiconductor layer structure;
   a plurality of unit cell transistors that are electrically connected, each unit cell transistor including a gate finger that has a longitudinal axis that extends in a first direction on the semiconductor layer structure, the gate fingers spaced apart from each other along a second direction; and
   a gate connector comprising a first portion having a longitudinal axis that extends in the second direction and a second portion having a longitudinal axis that extends in the first direction, wherein the second portion crosses the first portion, and the gate connector is connected to the gate fingers of the plurality of unit cell transistors,
   wherein the gate connector has a greater conductivity than the gate fingers.

2. The semiconductor device of claim 1, wherein the gate connector comprises titanium (Ti), titanium nitride (TiN), tantalum (Ta), tantalum nitride (TaN), and/or tungsten (W).

3. The semiconductor device of claim 1, wherein the second portion extends in the first direction to contact an upper surface of the gate finger of one of the plurality of unit cell transistors.

4. The semiconductor device of claim 3, wherein the gate connector further comprises a third portion that extends in the first direction below an upper surface of the semiconductor layer structure.

5. The semiconductor device of claim 1, wherein a lower surface of the gate connector contacts surfaces of the gate fingers.

6. The semiconductor device of claim 5, wherein a gate electrode of one of the gate fingers extends below an upper surface of the semiconductor layer structure.

7. The semiconductor device of claim 1, further comprising a connector insulating layer between the gate connector and the semiconductor layer structure.

8. The semiconductor device of claim 7, wherein the connector insulating layer extends in the second direction on an upper surface of the semiconductor layer structure between adjacent ones of the gate fingers.

9. The semiconductor device of claim 5, wherein a gate electrode of one of the gate fingers extends on an upper surface of the semiconductor layer structure.

10. A semiconductor device comprising:
a semiconductor layer structure;
a gate pad on the semiconductor layer structure; and
a gate electrode structure on the semiconductor layer structure and electrically coupled to the gate pad, wherein the gate electrode structure comprises:
a plurality of gate fingers each comprising a first material that extends in a first direction on the semiconductor layer structure; and
a gate connector comprising a second material and extending in the first direction, wherein the gate connector extends on and is connected to a gate finger of the plurality of gate fingers,
wherein a first conductivity of the first material of the gate fingers is lower than a second conductivity of the second material of the gate connector.

11. The semiconductor device of claim 10, wherein the first material comprises polysilicon or silicide.

12. The semiconductor device of claim 10, wherein the gate connector comprises a first portion and a second portion,
wherein the first portion of the gate connector extends in the first direction on the plurality of gate fingers,
wherein the second portion of the gate connector extends in a second direction on the plurality of gate fingers.

13. The semiconductor device of claim 10, wherein a respective gate electrode of the plurality of gate fingers extends below an upper surface of the semiconductor layer structure.

14. The semiconductor device of claim 10, further comprising a connector insulating layer extending between adjacent ones of the plurality of gate fingers,
wherein the connector insulating layer is between the gate connector and the semiconductor layer structure.

15. A semiconductor device comprising:
a semiconductor layer structure; and
a gate electrode structure on the semiconductor layer structure, wherein the gate electrode structure comprises:
a plurality of gate fingers each having a respective longitudinal axis that extends in a first direction on the semiconductor layer structure; and
a gate connector that is on the plurality of gate fingers, wherein a first portion of the gate connector has a longitudinal axis that extends in the first direction, and the first portion extends on the plurality of gate fingers, and
wherein a second portion of the gate connector extends in a second direction.

16. The semiconductor device of claim 15, wherein the plurality of gate fingers each comprise a first material, and the gate connector comprises a second material.

17. The semiconductor device of claim 16, wherein a third portion of the gate connector extends in the first direction below an upper surface of the semiconductor layer structure, and
wherein the first portion of the gate connector extends in the first direction on first portions of the plurality of gate fingers,
wherein the second portion of the gate connector extends in the second direction on second portions of the plurality of gate fingers.

18. The semiconductor device of claim 16, wherein the gate connector has a greater conductivity than the gate fingers.

19. The semiconductor device of claim 16, wherein the second material is different from the first material.

20. A semiconductor device comprising:
a semiconductor layer structure;
a gate pad on the semiconductor layer structure; and
a gate electrode structure on the semiconductor layer structure and electrically coupled to the gate pad, wherein the gate electrode structure comprises:
a plurality of gate fingers each comprising a first material that extends in a first direction on the semiconductor layer structure;
a gate connector comprising a second material that is connected to a gate finger of the plurality of gate fingers;
a connector insulating layer extending between adjacent ones of the plurality of gate fingers, wherein the connector insulating layer is between the gate connector and the semiconductor layer structure; and
a connector electrode layer between the connector insulating layer and the gate connector.

21. The semiconductor device of claim 20, wherein the gate connector extends on the gate finger of the plurality of gate fingers.

22. A semiconductor device comprising:
a semiconductor layer structure;
first and second unit cell transistors that are electrically connected, the first unit cell transistor and the second unit cell transistor comprising a first gate electrode and a second gate electrode spaced apart by a portion of the semiconductor layer structure, respectively; and
a gate connector connected to the first gate electrode and connected to the second gate electrode, and extending from the first gate electrode to the second gate electrode on the portion of the semiconductor layer structure between the first gate electrode and the second gate electrode,
wherein the gate connector comprises a first material, and the first gate electrode and the second gate electrode comprise a second material, different from the first material.

23. The semiconductor device of claim 22, further comprising a connector insulating layer between the gate connector and the semiconductor layer structure.

24. The semiconductor device of claim 22, wherein the gate connector continuously extends between the first gate electrode and the second gate electrode, and the second material has a lower conductivity than the first material.

25. The semiconductor device of claim 22, wherein the gate connector comprises a first portion, and wherein the gate connector further comprises a second portion that crosses the first portion to contact an upper surface of the first gate electrode.

26. The semiconductor device of claim 25, wherein the gate connector further comprises a third portion that contacts the first gate electrode below an upper surface of the semiconductor layer structure.

27. A semiconductor device comprising:

a semiconductor layer structure;

a plurality of unit cell transistors that are electrically connected, each unit cell transistor including a gate finger that has a longitudinal axis that extends in a first direction on the semiconductor layer structure, wherein the gate fingers are in trenches that are distinct from and spaced apart from each other along a second direction, and wherein the trenches are free of portions that longitudinally extend in the second direction; and a gate connector having a longitudinal axis that extends in the second direction, wherein the gate connector is connected to the gate fingers of the plurality of unit cell transistors and each of the gate fingers that is connected to the gate connector is in a respective one of the trenches, wherein the gate connector has a greater conductivity than the gate fingers.

28. The semiconductor device of claim 27, wherein the gate fingers each comprise a first material, and the gate connector comprises a second material different from the first material.

29. The semiconductor device of claim 27, wherein the gate connector comprises a first portion and a second portion, wherein the first portion of the gate connector extends in the first direction on the gate fingers, and the second portion of the gate connector extends in the second direction on the gate fingers.

* * * * *

UNITED STATES PATENT AND TRADEMARK OFFICE
CERTIFICATE OF CORRECTION

PATENT NO. : 12,094,876 B2  
APPLICATION NO. : 16/863797  
DATED : September 17, 2024  
INVENTOR(S) : Lichtenwalner et al.

Page 1 of 1

It is certified that error appears in the above-identified patent and that said Letters Patent is hereby corrected as shown below:

In the Specification

Column 4, Lines 40-41: Please remove the paragraph break between "FIG. 2B." and "FIG. 2E"

Column 4, Lines 64-65: Please remove the paragraph break between "FIG. 6B." and "FIG. 6E"

Column 10, Line 3: Please correct "(n)" to read --($n^-$)--

Column 13, Lines 40: Please correct "(n)" to read --($n^-$)--

Column 21, Line 56: Please correct "(n)" to read --($n^-$)--

Signed and Sealed this  
Tenth Day of December, 2024

Katherine Kelly Vidal  
*Director of the United States Patent and Trademark Office*